(12) United States Patent
Chiang et al.

(10) Patent No.: US 8,906,784 B2
(45) Date of Patent: Dec. 9, 2014

(54) GRAPHENE EPITAXIED ON SIC, WITH AN OPEN BAND GAP AND MOBILITY COMPARABLE TO STANDARD GRAPHENE WITH ZERO BAND GAP

(75) Inventors: Shirley Chiang, Davis, CA (US); Hanna Enriquez, Sceaux (FR); Hamid Oughaddou, Breuillet (FR); Patrick Soukiassian, Saint Remy les Chevreuse (FR); Antonio Tejeda Gala, Fresnes (FR); Sébastien Vizzini, Marseilles (FR)

(73) Assignee: Commissariat á l'Energie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 13/508,343

(22) PCT Filed: Nov. 9, 2010

(86) PCT No.: PCT/EP2010/067134
§ 371 (c)(1),
(2), (4) Date: Oct. 1, 2012

(87) PCT Pub. No.: WO2011/054968
PCT Pub. Date: May 12, 2011

(65) Prior Publication Data
US 2013/0126865 A1     May 23, 2013

(30) Foreign Application Priority Data
Nov. 9, 2009 (FR) ...................................... 09 57917

(51) Int. Cl.
*H01L 21/335* (2006.01)
*H01L 21/66* (2006.01)
*H01L 21/02* (2006.01)
*B82Y 40/00* (2011.01)

(52) U.S. Cl.
CPC .......... *H01L 22/12* (2013.01); *H01L 21/02433* (2013.01); *H01L 21/02516* (2013.01); *H01L 21/02447* (2013.01); *H01L 21/02381* (2013.01); *H01L 21/02378* (2013.01); *H01L 21/02527* (2013.01); *H01L 22/00* (2013.01); *B82Y 40/00* (2013.01); *H01L 21/02664* (2013.01)
USPC .............. 438/478; 438/142; 438/197; 438/16

(58) Field of Classification Search
CPC .................................................... H01L 21/02527
USPC ........................ 257/48; 438/478, 142, 197, 16
See application file for complete search history.

(56) References Cited

U.S. PATENT DOCUMENTS

| | | | |
|---|---|---|---|
| 8,358,008 B2 * | 1/2013 | Wada et al. .................... | 257/750 |
| 2011/0269299 A1 * | 11/2011 | Zhang et al. .................. | 438/478 |

OTHER PUBLICATIONS

Guisinger et al. "Exposure of Epitaxial Graphene on SiC (0001) to Atomic Hydrogen" Nano Letters vol. 9 No. 4, 2009, p. 1462-1466.*

(Continued)

*Primary Examiner* — Zandra Smith
*Assistant Examiner* — Damian A Hillman
(74) *Attorney, Agent, or Firm* — Nixon Peabody LLP

(57) ABSTRACT

A method of manufacturing a modified structure comprising a semiconducting modified graphene layer on a substrate, comprising the subsequent following steps:
supply of an initial structure comprising at least one substrate,
formation of a graphene layer on the substrate,
hydrogenation of the initial structure by exposure to atomic hydrogen,
characterized in that the hydrogenation step of the graphene layer is done with an exposure dose between 100 and 4000 Langmuirs, and forms a modified graphene layer.

14 Claims, 13 Drawing Sheets

(56) References Cited

OTHER PUBLICATIONS

Bostwick et al. "Quasiparticle Transformation during a Metal-Insulator Transition in Graphene" Physical Review Letters, PRL 103, 2009, p. 056404-1-056404-4.*

Guisinger et al. (Guisinger) "Exposure of Epitaxial Graphene on SiC(0001) to Atomic Hydrogen" Nano Letters, 2009 vol. 9, No. 4, p. 1462-1466.*

Bostwick et al. (Bostwick) "Quasiparticle Transformation during a Metal-Insulator Transition in Graphene" Physical Review Letters, 2009, PRL 103, p. 056404-1-056404-4.*

Balog, R., et al. "Atomic Hydrogen Adsorbate Structures on Graphene", Journal of the American Chemical Society, American Chemical Society, NY, U.S., vol. 131, No. 25, May 29, 2009, pp. 8744-8745.

Bostwick, A., et al. "Quasiparticle Transformation during a Metal-Insulator Transition in Graphene", Physical Review Letters, American Physical Society, NY, U.S., vol. 103, No. 5, Jul. 29, 2009, pp. 56404/1-56404/4.

Elias, D. C., et al. "Control of Graphene's Properties by Reversible Hydrogenation: Evidence for Graphane", Science, American Association for the Advancement of Science, Washington, DC, vol. 323, No. 5914, Jan. 30, 2009, pp. 610-613.

Guisinger, N. P., et al. "Exposure of Epitaxial Graphene on SiC(0001) to Atomic Hydrogen", Nano Letters, American Chemical Society, Washington, DC, U.S., vol. 9, No. 4, Mar. 20, 2009, pp. 1462-1466.

Luxmi, et al. "Temperature Dependence of Epitaxial Graphene Formation on SiC(0001)", Journal of Electronic Materials, Warrendale, PA, U.S., vol. 38, No. 6, Oct. 21, 2008, pp. 718-724.

Wu, X., et al. "The Epitaxial-Graphene/Graphene-Oxide Junction, an Essential Step Towards Epitaxial Graphene Electronics", Physical Review Letters, vol. 101, Issue 2, Jul. 7, 2008, 5 pages.

Preliminary Search Report in French Application No. 0957917 dated Sep. 10, 2010.

International Search Report in PCT Application No. PCT/EP2010/067134 dated Jan. 27, 2011.

International Preliminary Report on Patentability in PCT Application No. PCT/EP2010/067134 dated Jan. 30, 2012.

* cited by examiner

GRAPHENE EPITAXIED ON SIC, WITH AN OPEN BAND GAP AND MOBILITY COMPARABLE TO STANDARD GRAPHENE WITH ZERO BAND GAP

CROSS REFERENCE TO RELATED APPLICATIONS OR PRIORITY CLAIM

This application is a National Phase of PCT/EP2010/067134, filed Nov. 9, 2010, entitled, "EPITAXIAL GRAPHENE ON SIC, HAVING AN OPEN GAP AND MOBILITY COMPARABLE TO THAT OF STANDARD ZERO-GAP GRAPHENE", the contents of which are incorporated herein by reference in their entirety.

TECHNICAL DOMAIN

The invention relates to the field of the microelectronics industry and particularly the use of graphene and its carrier transport properties for this industry. Graphene existing in the form of semi-infinite crystalline monolayers of carbon atoms organised in sp2 formation, has very attractive mechanical, electrical and electronic properties, like carbon nanotubes that are better known to the general public.

In addition to its mechanical properties, the electron mobility of graphene can be as high as 250000 $cm^2/V \cdot s$ at ambient temperature and 200000 $cm^2/V \cdot s$ at high temperature. As a comparison, the mobility of carbon nanotubes is approximately 100000 $cm^2/V \cdot s$ at ambient temperature, the electron mobility of silicon is close to 1400 $cm^2/V \cdot s$ and the electron mobility of copper is of the order of 4400 $cm^2/V \cdot s$.

STATE OF PRIOR ART

Graphene is a material formed from an atomic plane of carbon C atoms in an sp2 structure characterised by a hexagonal structure frequently considered to have a "honeycomb" form 11 as shown in FIG. 1A in three dimensions. Its atomic structure and its electronic properties were predicted 60 years ago. Experimentally, its existence was not demonstrated until very much later, firstly by means of an epitaxy to enable auto-organised formation on the surface of silicon carbide (SiC) by sublimation of the silicon present at the surface of the SiC in a furnace or in an ultravacuum, and then by means of an epitaxy on the metal surfaces, or by exfoliation of graphite.

An epitaxied graphene layer 2 formed on an SiC substrate 1 as illustrated in perspective in FIG. 1A and in section in FIG. 1B, has the advantage of being present on a high quality semiconducting substrate 1 with a wide band gap. Therefore, substrate 1 may be considered as being insulating if it is not doped. This makes the epitaxied graphene layer 2 on an SiC substrate 1 useable for the microelectronics industry. Methods used by the silicon technology are then applicable to the epitaxied graphene layer 2 on an SiC substrate 1, for example like lithography.

This is not the case for exfoliated graphene that would have to be transferred onto an insulating substrate "sheet by sheet" in order to cover a substrate before any integration in microelectronic technology. Such a method is not very compatible with the industrial production of structures.

Furthermore, due to the nature of the conducting substrate, the epitaxied graphene layer 2 present on a metal substrate 1 is not very compatible or not at all compatible with electronics applications. A conducting substrate forms a conducting plane under the graphene, in electrical contact with the graphene and any electron initially present in the epitaxied graphene layer 2 may be captured by the subjacent metal and circulate.

Graphene is frequently considered as a semiconductor with zero or practically zero band gap, in other words it is a material with a valency band and a conducting band in which the valency band is either in contact with the conducting band, or it is separated from it by a very small band gap less than 0.05 eV and frequently considered to be zero. In comparison, the band gap in the semiconducting material with the smallest band gap that can be used in microelectronics is of the order of 0.1 eV.

As mentioned above, the mobility of electrons in graphene is close to 250000 $cm^2/V \cdot s$. This exceptional mobility is due to characteristics of the shape of the valency band of graphene, which forms a Dirac cone. This makes electrons behave like Dirac fermions with zero mass during transport of electrons.

This characteristic can be observed by an Angle Resolved PhotoEmission Spectroscopy (ARPES) method, also called Angle Resolved Ultraviolet Photoemission Spectroscopy (ARUPS) when a photon source emitting only in the ultraviolet is used, by direct observation of two Dirac cones, approximately adjacent to each other, one representing the valency band and the other illustrating the position of the conducting band, or in the form of a straight distribution of electronic states in the valency band. The term straight herein is used to mean linear, in other words a straight line without any curvature along a straight segment representing the dispersion of electronic states. Since the dispersion of electronic states is symmetrical, observation of a single curve using the ARPES method induces the valency band to be in the form of a Dirac cone.

Semiconductors are distributed into three classes depending on their band gap: semiconductors such as InSb, InAs or GaSb with a small band gap between 0.1 eV and 0.7 eV, semiconductors such as silicon, GaAs or InP with a medium band gap between 0.7 eV and 2 eV, and semiconductors such as Band gap, SiC, ZnO, GaN, AlN, BN or diamond, etc. with a wide band gap of more than 2 eV.

Thus, it is very important to open the band gap of graphene before it can be used in the microelectronics industry to make a semiconductor.

Those skilled in the art know that oxidation of graphene epitaxied on SiC causes a band gap opening of up to 0.7 eV by causing the formation of graphene oxide [1] which has a very weak electronic mobility.

According to another approach, the graphene band gap was opened by hydrogenation in the special case of exfoliated graphene causing the formation of "graphane" [2]. However, the formation of graphane requires hydrogenation on two sides of the graphene plane and therefore cannot be applied for graphene present on a substrate.

Furthermore, the graphane thus obtained is an insulator and the mobility of electrons in it is 10 $cm^2/V \cdot s$. This shows that the advantages of graphene, in particular its carrier transport property, disappear after such hydrogenation.

Finally, the mesh parameter is reduced by 5% to 10% under the action of hydrogen. Such a reduction in the mesh parameter does not cause any problems for an exfoliated graphene sheet free of any substrate, but would cause the appearance of high stresses if the graphene layer were bonded to a substrate.

Better results have been obtained by a Danish team at the University of Aarhus and published at the ACSIN-10 conference held from Sep. 21 to 25, 2009 in Granada, Spain. This team presented a study of the interaction of atomic hydrogen with an epitaxied graphene layer 2 present on an iridium substrate 1 [3].

The results of "scanning tunneling microscopy" (STM) and "scanning tunneling spectroscopy" (STS) show that hydrogenation of an epitaxied graphene layer 2 present on an iridium substrate 1 can open the graphene band gap by 0.45 eV.

However, this method causes a loss in the electronic transport properties of graphene. The dispersion of electronic states observed by the ARPES method and presented at this conference, shows that hydrogenation of the epitaxied graphene layer 2 caused the formation of a curvature in the dispersion of the electronic states in the epitaxied graphene layer 2. Therefore, it is no longer linear. The valency band of such a semiconducting graphene is not a Dirac cone.

Furthermore, since the substrate is metallic, it is not easy to use such a product in a microelectronics production line.

Two different studies apply to the hydrogenation of an epitaxied graphene layer 2 on an SiC substrate 1 under two hydrogenation conditions. One of the studies presents a method for producing an insulating graphene [4] in which a band gap opening of less than 0.1 eV also causes a curvature in the dispersion of electronic states of the graphene. Therefore, such a method cannot be used to produce a semiconducting graphene on SiC, due to the small opening of the band gap and the loss of electronic mobility properties.

The second study [5], carried out on graphene partially present on an SiC substrate 1, uses hydrogenation with a total dose of 1200 Langmuirs; a Langmuir is a gas proportioning unit equal to $10^{-6}$ torr·s, namely 0.133 mPa·s. It has been observed that although the electronic and transport properties are modified locally, hydrogenation does not cause any change to the graphene band gap.

At the moment, graphene has several defects. The first defect, namely that graphene is a semiconductor with "zero" band gap or a semi-metal, has already been presented above.

Another defect, independent of the first, is that many methods of manufacturing graphene layers on a support substrate produce interface defects between the graphene layer and the support substrate. These defects may be electronic wells, short circuits or they may be generated by a large misalignment between two crystalline lattices, namely a crystalline lattice specific to the substrate and a crystalline lattice representative of the graphene layer.

Graphene layers have a third defect related to this second defect, in that it is complicated to obtain large areas of graphene with no interface defect.

PRESENTATION OF THE INVENTION

The inventors have produced a semiconducting graphene layer with a wide band gap epitaxied onto an SiC substrate because this method, epitaxy of graphene, is one of the least expensive and one of the easiest to apply if large areas of graphene are required, and particularly if a semiconducting graphene substrate is required.

Although the state of the art suggests that hydrogenation of graphene induces a curvature in the dispersion of electronic states and therefore a loss of the exceptional mobility property of electrons, the inventors have obtained at least one semiconducting graphene layer on an SiC substrate by means of hydrogenation with a wide band gap opening and a linear dispersion of electronic states. The invention is based on the use of hydrogenation at a relatively low dose.

Therefore, the first step of the invention relates to a method of manufacturing a structure comprising a substrate and at least one layer of modified semiconducting graphene, in other words comprising a band gap of between 0.2 eV and 1.8 eV, for example up to 1.3 eV measured by scanning tunneling spectroscopy, and that its dispersion of electronic states as observed by Angle Resolved PhotoEmission Spectroscopy (ARPES or ARUPS) is such that it is either a valency band forming a Dirac cone or a linear dispersion of electronic states; said modified graphene layer being present on said substrate; the method comprising the following steps:

supply of an initial structure comprising at least one non-metallic substrate capable of supporting a graphene layer;

formation of a graphene layer on the substrate;

hydrogenation of the initial structure by exposure to atomic hydrogen.

Said method is characterised in that the hydrogenation step of the graphene layer is done using an appropriate exposure dose evaluated in advance as a function of a given reaction test set-up. The appropriate exposure dose is low and is measured as a few hundred or a few thousand Langmuirs.

The appropriate exposure dose has been evaluated by making measurements of the number of graphene layers and the values of the graphene band gap, for example using the STS method, for initial structures with a graphene layer subject to exposure doses within a range of doses varying from 100 Langmuirs up to at least 1100 Langmuirs or up to 4000 Langmuirs or 5000 Langmuirs by taking samples in said range. At least one graphene hydrogenation cycle is then identified. The appropriate exposure dose is selected for a value between two successive sampled doses, for which a band gap greater than 0.2 eV was measured on at least one modified graphene layer in at least one of the samples.

The exposure doses are obtained preferably with a hydrogen pressure less than or approximately equal to $10^{-4}$ Pascals or less than or approximately equal to $10^{-6}$ Pascals or $10^{-7}$ Pascals.

In particular, the invention relates to a method of manufacturing a structure comprising a substrate and at least one modified semiconducting epitaxied graphene layer, the epitaxied graphene layer having a band gap of between 0.2 eV and 1.8 eV measured by scanning tunneling spectroscopy, and having a dispersion of electronic states observed by Angle Resolved PhotoEmission Spectroscopy (ARPES or ARUPS) that is either a valency band forming a Dirac cone or a linear dispersion of electronic states, called the modified graphene layer, present on said substrate. The method includes the following steps:

supply of an initial structure comprising at least a non-metallic substrate that can support a graphene layer;

formation of a graphene layer on the substrate;

hydrogenation of the initial structure by exposure to atomic hydrogen.

The method is characterised in that the hydrogenation step of the graphene layer is done at an exposure dose of between 100 Langmuirs and 4000 Langmuirs, namely between 13 mPa·s and 533 mPa·s. An exposure dose given in Langmuirs corresponds to a given pressure during a given time.

Thus for the same exposure dose, the exposure time can vary from one manufactured structure to another.

As mentioned above, the doses used can vary depending on the shape of the test set-up, because the shape can modify the relation between one exposure dose used and the opening of the band gap in the corresponding modified graphene layer. Those skilled in the art will be able to make the necessary tests to calibrate the method according to the invention as a function of the special features of the reaction chamber that they use.

The hydrogenation step can advantageously introduce hydrogen atoms added at the surface of the substrate, for the formation of the modified graphene layer.

The method can vary as a function of the substrate used. In some variants of the method according to the invention, the hydrogenation step takes place after the formation of the graphene layer. Hydrogenation can then modify the graphene layer to make the graphene semiconducting or to form a new graphene layer which is advantageously made of semiconducting graphene.

Thus, according to a first advantageous embodiment of the method according to the invention, the exposure dose during hydrogenation may be between 100 and 1100 Langmuirs, to be adapted depending on the test set-up used, the graphene layer becoming the modified graphene layer, comprising a non-zero semiconducting band gap. This means that the modified graphene layer comprises a band gap between 0.2 eV and 1.8 eV, measured by scanning tunneling spectroscopy, and that it has a dispersion of electronic states observed by Angle Resolved PhotoEmission Spectroscopy (ARPES or ARUPS) that is like either a valency band forming a Dirac cone or a linear dispersion of electronic states.

Such a method means that the initial structure can be submitted to an optimum dose of atomic hydrogen, the added hydrogen atoms being inserted between the graphene layer and the substrate. As will be described later, the inventors have observed that there is a threshold exposure dose that enables a maximum band gap opening for a graphene layer. Therefore, there is a minimum exposure dose below which the band gap of the graphene layer will not open and a maximum dose beyond which the band gap becomes too small for the graphene layer to be considered as being semiconducting and useable in microelectronics. Therefore the first advantage of such a method over the state of the art is that an exposure dose can be chosen to give a band gap opening attractive to the microelectronics industry.

In a first advantageous embodiment of the invention, the exposure dose during hydrogenation is between 200 and 500 Langmuirs, to be adapted as a function of the test set-up used. This exposure dose is less than the threshold dose, and yet it can give an interesting band gap opening for the microelectronics industry. Therefore this exposure dose can cause a given band gap opening that can then be increased further if the band gap opening is considered to be insufficient. This could be made during a second hydrogenation step according to the first embodiment of the invention. As mentioned above, below the threshold exposure dose, an increase in the exposure dose causes an increase in the band gap opening and above this threshold exposure dose, an increase in the exposure dose causes a reduction in the band gap opening from the maximum band gap opening.

A second advantageous embodiment of the method according to the invention can be applied, regardless of whether or not the graphene layer was formed before the hydrogenation step. In this embodiment, at least one surface layer of the substrate is made of SiC. The exposure dose is then between 1300 and 4000 or 5000 Langmuirs, to be adapted as a function of the test set-up used. In this second embodiment, at least one last carbon plane is decoupled from the surface layer made of SiC, and after hydrogenation, forms at least an additional modified graphene layer.

Thus, in a first variant of this advantageous embodiment of the method according to the invention, the substrate is made of SiC and the exposure dose during hydrogenation is between 1300 Langmuirs and 2500 Langmuirs. In being positioned well beyond the above-mentioned threshold dose in the case of the first advantageous embodiment, a modified graphene layer is formed with a practically zero band gap. Under the action of atomic hydrogen, a last carbon plane is also decoupled from the SiC substrate and forms an additional modified graphene layer. At least one additional modified graphene layer is made of semiconducting graphene with a band gap of more than 0.2 eV with at least one valency band in the form of a Dirac cone or linear dispersion of electronic states.

Therefore, it can be understood that for this second advantageous embodiment of the method according to the invention, a structure can be used that does not initially have a graphene layer, hydrogenation forming a modified graphene layer on the SiC substrate. Conversely, if an initial structure comprising a standard graphene layer is used, then a modified dual graphene layer will be formed. In other words, if the graphene layer is not formed before the hydrogenation step, this step induces formation of the graphene layer. If a graphene layer was already formed before the hydrogenation step, an additional graphene layer is then formed such that the initial layer is made of practically metallic graphene and the additional layer forms a first modified semiconducting graphene layer.

In a second variant of this advantageous embodiment of the method according to the invention, the exposure dose is increased even further. The exposure dose may be between 2500 and 4000 or 5000 Langmuirs, to be adapted as a function of the test set-up used. Thus, two additional modified graphene layers can be formed on the substrate. If there were an initial graphene layer, then it would be separated from the substrate by the two additional modified graphene layers. At least one of the additional modified graphene layers is made of semiconducting graphene with a band gap of more than 0.2 eV and with at least one valency band in the form of a Dirac cone or a linear dispersion of electronic states. If there are several made of semiconducting graphene, they may have different band gaps.

It is then possible to form a diode with a heterostructure comprising a surface zone with a metallic behaviour, formed from the initial graphene layer superposed on two semiconducting layers with different band gaps formed from two additional modified graphene layers. Such a diode has the effects of a diode with a heterostructure, effects of electronic mobility specific to graphene and the fact of being composed of a superposition of three atomic planes.

In this second advantageous embodiment of the method according to the invention, when graphene is semiconducting, it keeps its electronic mobility properties characterized by a valency band in the form of a Dirac cone or at least by a linear dispersion of electronic states.

Furthermore, in this second advantageous embodiment of the method according to the invention, when there is a graphene layer initially present before the hydrogenation step, this layer may become practically metallic. In other words, its band gap is closed again.

The substrate is advantageously made of SiC. This is a very attractive material in microelectronics; it is a wide band gap material that also has high thermal conductivity. Finally, it is relatively easy to form an epitaxied graphene layer from SiC.

If the substrate is made of SiC, in the first advantageous embodiment of the method according to the invention, the added hydrogen atoms form a buffer plane between the modified graphene layer and the SiC substrate. A majority of hydrogen atoms are bonded to the SiC in the substrate. This buffer plane can electronically decouple the modified graphene layer from the substrate.

In a method or a structure according to the invention, the semiconducting substrate is made of an SiC material. This may be an SiC substrate made of any SiC polytype, along any crystalline orientation. Furthermore, the graphene layer may be present on a silicon face or a carbon face of the SiC substrate. This enables some simplification in the choice of the substrate. Furthermore, this means that the face of the substrate can be chosen to be made of SiC, silicon or carbon, independently from the desire to use a modified graphene layer according to the invention. Therefore, this assures increased flexibility of use.

The SiC substrate may originate from a silicon substrate. It may even be a silicon substrate comprising an SiC surface layer. In such a structure applied to the invention, the SiC surface layer is between the graphene layer and the silicon substrate.

Therefore, it can be understood that the substrate can originate from a silicon substrate and it can comprise at least one SiC surface layer. This enables the formation of large SiC layers obtained by surface treatment of an SiC standard substrate, for example by carbonation. The growth of graphene may take place alternately on SiC with a cubic crystalline lattice (3C) and or a hexagonal crystalline lattice (6H or 4H).

Secondly, the method is advantageously characterized in that at least one heat treatment is applied to the structure at a temperature between 200° C. and 400° C., preferably between 250° C. and 350° and advantageously close to 300° C., during or after the hydrogenation step.

The main advantage of the method according to the invention is that heat treatment causes diffusion of the hydrogen atoms added onto the substrate surface. If the graphene layer is formed before the hydrogenation step, heat treatment can cause faster and more uniform diffusion of the added hydrogen atoms through the graphene layer. Heat treatment can also homogenise a density of hydrogen atoms added onto the surface of the substrate and get them to react preferentially with the substrate so as to not degrade the modified graphene layer. This part of the method means that an important property of standard graphene, namely exceptional electronic mobility, can be kept in the modified graphene layer. This step in the method also makes it easier to open the band gap without modifying the dispersion of electronic states in the valency band of the graphene layer. Said dispersion of electronic states remains linear and forms a Dirac cone. If there is no graphene layer before the hydrogenation step, the heat treatment can evacuate atoms from a last silicon plane present on the substrate surface and homogenise an interaction between the last silicon plane and the added hydrogen atoms.

In a method according to the invention, the heat treatment may comprise annealing taking place during the hydrogenation step called hydrogenation annealing. Hydrogenation annealing then takes place at a temperature of between 200° C. and 400° C., preferably between 250° C. and 350° and advantageously close to 300° C. This step enables the diffusion of added hydrogen atoms directly during their deposition on the structure. Therefore any damaging interaction between the added hydrogen atoms and the graphene layer is limited.

Instead of or in addition to the above-mentioned hydrogenation annealing, the method may be such that the heat treatment comprises annealing that takes place after the hydrogenation step, call post-hydrogenation annealing, at a temperature of between 200° C. and 400° C., preferably between 250° C. and 350° and advantageously close to 300° C., and which has a duration of between one minute and twenty minutes, advantageously five minutes. It is then possible to do identical post-hydrogenation annealing for any exposure dose. Furthermore, for the same exposure dose, the exposure time can vary from one structure to another. Post-hydrogenation annealing can then dissociate the annealing duration from the exposure time. If annealing is done in a furnace, it is also possible to impose annealing on several structures simultaneously. Post-hydrogenation annealing can be applied regardless of whether hydrogenation annealing took place during the hydrogenation step or hydrogenation took place at ambient temperature.

In a method according to the invention, the atomic hydrogen gas can be produced by a cold plasma, as an alternative to standard production by cracking described below. In this case, there is no hydrogenation annealing during the hydrogenation step and post-hydrogenation annealing is applied.

Alternately, the graphene layer may have been formed and an oxidation step may have been applied to it inducing opening of a band gap in the graphene layer, before the hydrogenation step took place. This oxidation step preceding the supply of an initial structure forms defects that reduce the electronic mobility properties of the graphene layer. In this case, the hydrogenation step of the method according to the invention passivates defects formed by oxidation.

Similarly, if the graphene layer is formed before the hydrogenation step, the structure may initially comprise electronic traps called critical defects between the substrate and the graphene layer. These electronic traps may be pieces of carbon nanotubes or other carbonated structures comprising pendant bonds. The critical defects then reduce the electronic mobility of the standard graphene layer in the initial structure. The hydrogenation step in the method according to the invention passivates the critical defects and therefore a modified graphene layer with a high electronic mobility can be achieved.

The invention also relates to a structure comprising at least one semiconducting or insulating substrate, and at least one graphene layer on this substrate, characterised in that the graphene layer is a modified graphene layer called a first modified semiconducting graphene layer. According to the invention, the first modified graphene layer has a band gap of between 0.25 eV and 1.8 eV, measured by scanning tunneling spectroscopy. Furthermore, the modified graphene layer has a dispersion of electronic states observed by Angle Resolved PhotoEmission Spectroscopy (ARPES or ARUPS) in the form of either a valency band forming a Dirac cone or a linear dispersion of electronic states.

Advantageously, the first modified graphene layer is practically electronically decoupled from the substrate. This makes the graphene layer independent of any doping or variation of doping in the substrate.

The first modified graphene layer may be an epitaxied graphene layer.

The invention also relates to a structure also comprising a second modified graphene layer with a metallic behaviour or a practically zero band gap. The second modified graphene layer is then separated from the substrate by the first modified graphene layer, the first graphene layer having a band gap of more than 0.2 eV.

The invention also relates to a structure comprising at least a third modified graphene layer inserted between the first modified graphene layer and the second modified graphene layer. Preferably, the third modified graphene layer is made of semiconducting graphene with a band gap of more than 0.2 eV and with at least one valency band in the form of a Dirac cone or a linear dispersion of electronic states. The third graphene layer preferably has a different band gap from the first graphene layer band gap, which is advantageously smaller.

The substrate is preferably a semiconducting substrate so that it can be integrated into the structure according to the invention in conventional microelectronics lines. The substrate advantageously comprises a surface layer made of SiC.

There may be several graphene layers in a method or a structure according to the invention. Therefore, there are several modified graphene layers by the end of the method or in the structure according to the invention. These are then stacked on each other and are practically decoupled from each other electronically.

The modified graphene layer(s) in a method or a structure according to the invention may have a «p» type doping.

BRIEF DESCRIPTION OF THE DRAWINGS

The invention will be better understood and other details, advantages and characteristics of it will appear after reading the following description given as a non-limitative example with reference to the appended drawings in which.

Identical, similar or equivalent parts of the different figures have the same numeric references to make it easy to change from one figure to another.

The different parts shown in the figures are not all necessarily at the same scale, to make the figures more easily legible.

The figures illustrating the various embodiments of the device according to the invention are given as examples and are not limitative.

DETAILED PRESENTATION OF PARTICULAR EMBODIMENTS

Epitaxied or non-epitaxied standard graphene is a material with a very high electronic mobility property as described above.

Figure 1A:
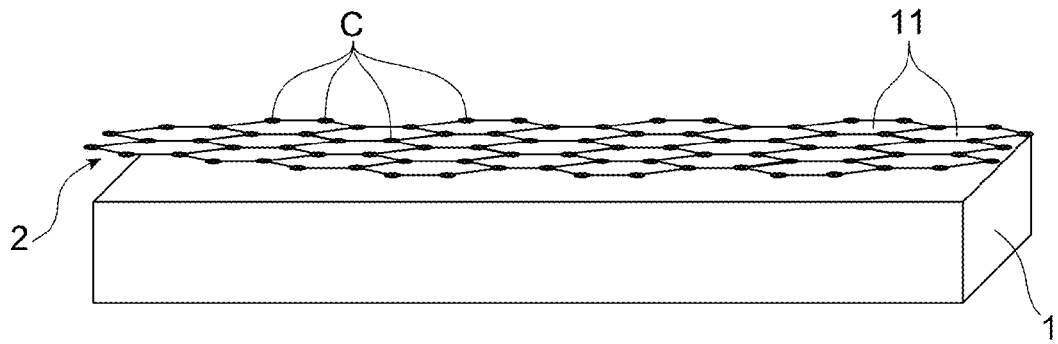
FIGS. 1A and 1B show a standard graphene layer on a substrate according to the state of the art in a three-dimensional view and in a sectional view.
Figure 1B:
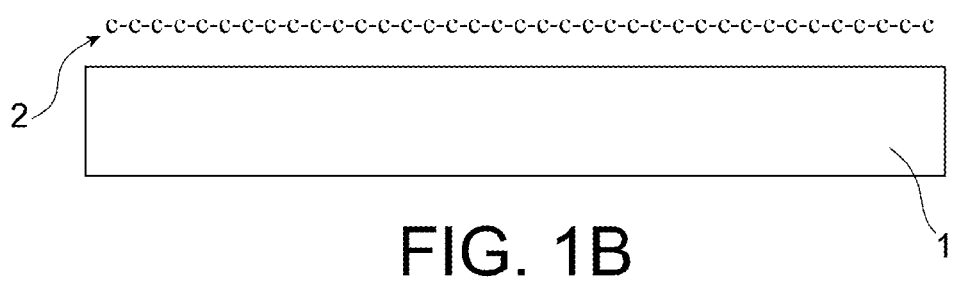
Figure 2:
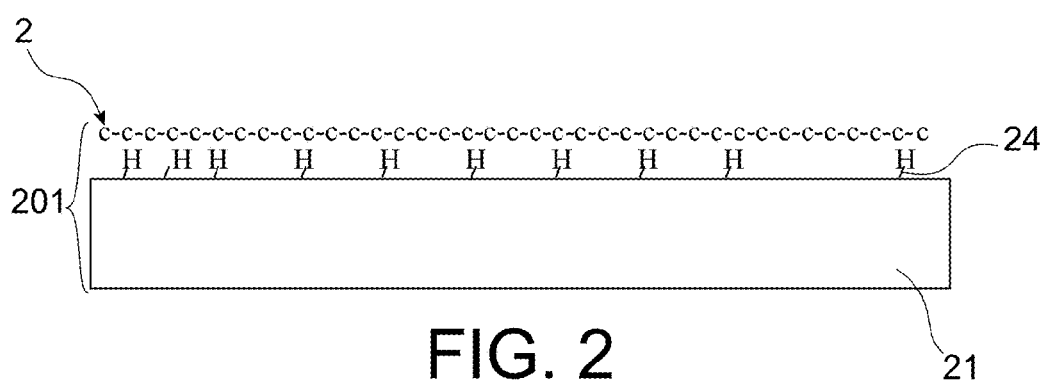
FIG. 2 shows a modified structure according to the invention comprising at least one modified semiconducting graphene layer.

As shown in FIG. 2, the invention relates firstly to obtain a modified structure 201 (201 should also be indicated in FIG. 2, as is done below for structures 601, 801, etc.) such as a modified semiconducting epitaxied graphene layer 23 present on a semiconducting or insulating substrate 21. In the invention, the modified epitaxied graphene layer 23 called the modified graphene layer has the properties of a standard epitaxied graphene layer. In particular, according to the invention, the electronic mobility property is kept in the modified graphene layer 23 present in the structure 201 according to the invention. The standard epitaxied graphene and modified epitaxied graphene layers are called as such because the graphene in them is generally formed by epitaxy. However in some cases, the graphene layer in question is not formed by epitaxy, particularly when the invention makes it possible to form an additional graphene layer.

Furthermore, this figure shows one advantageous embodiment of the invention in which, as will be explained later, the added hydrogen atoms H are bonded to the substrate 21 by chemical bonds 24.

More precisely, the structure 100 according to the invention comprises a modified graphene layer 3 with a band gap of between 0.20 eV and 1.8 eV, preferably between 0.25 eV and 1.5 eV, for example 1 eV. In particular embodiments, the band gap in the modified epitaxied graphene layer 3 may be 0.25 eV or 1.3 eV or 0.40 eV as shown in the corresponding FIGS. 3A and 3B and 3C.

FIGS. 3A, 3B, 3C and 3D are graphs in which the ordinates represent the logarithm of a measured intensity I, in nanoamperes, circulating in a graphene layer obtained by epitaxy and present on an SiC substrate, as a function of the applied voltage U in volts represented by the abscissas. Each figure is obtained by studying the epitaxied graphene layer using a scanning tunneling spectroscopy (STS) method. This method can measure the band gap (7A, 7B, 7C) of a tested material, in this case semiconducting graphene. In the case of a semiconducting material comprising two energy bands, a valency band and a conducting band separated by a band gap, the voltage U applied to this tested material can supply energy to electrons present in the valency band and allow them to pass into the conducting band by passing through the band gap. This causes the circulation of a current.

In these figures, a difference can be seen between a smaller positive voltage U2 enabling current to pass, characteristic of the conducting band, and a smaller negative voltage U1 enabling current to pass, characteristic of the valency band. This difference can be considered to measure the value of the band gap. The relative positions of the smallest negative voltage U2 and the smallest positive voltage U1 relative to a zero voltage are representative of the positions of the valency band and the conducting band relative to the Fermi level.

Figure 3A:
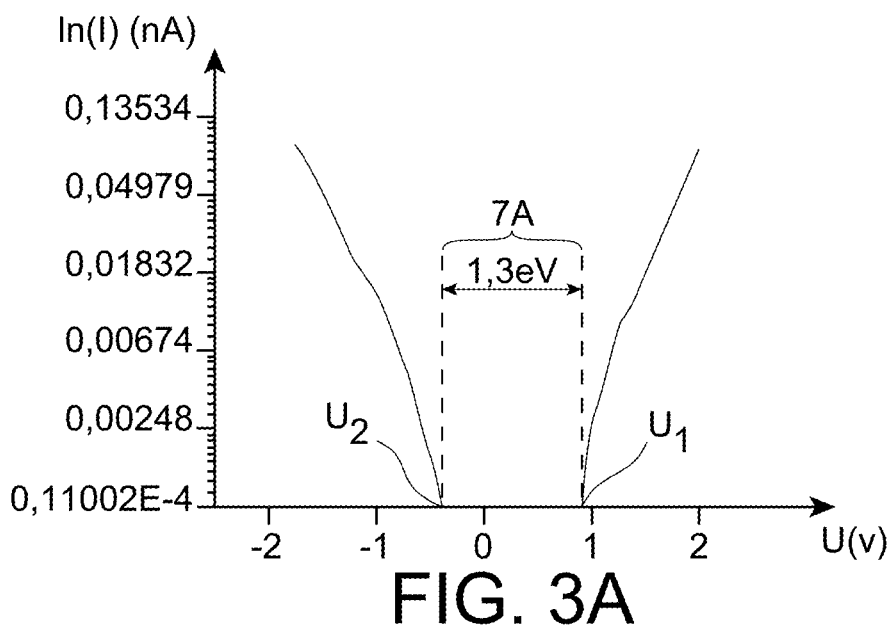
FIGS. 3A to 3D are graphs showing graphene layer band gap measurements by STS according to a first, a second, a third embodiment of the invention according to the state of the art.

FIG. 3A shows a measurement obtained by STS of the band gap 7A of a modified graphene layer present in a structure according to a first particular embodiment of the invention.

The band gap 7A, the difference between the smallest positive voltage U1 at which current can pass and the smallest negative voltage U2 at which the current can pass, is measured approximately equal to 1.3 eV. Since the null voltage is 0.33 V from the smallest negative voltage U2 at which current can pass, the Fermi level is 0.33 V above the valency band, namely 0.33 eV expressed in electrons-volts. Thus, since the Fermi level is closer to the valency band than to the conducting band, the modified graphene layer may be considered as being «p» doped. For a modified graphene layer obtained according to the method described below with an exposure dose to atomic hydrogen with a dose of 500 Langmuirs, a modified graphene layer with a band gap of 1.3 eV (FIG. 3A) is obtained which behaves like a p doped semiconducting material.

Figure 3B:
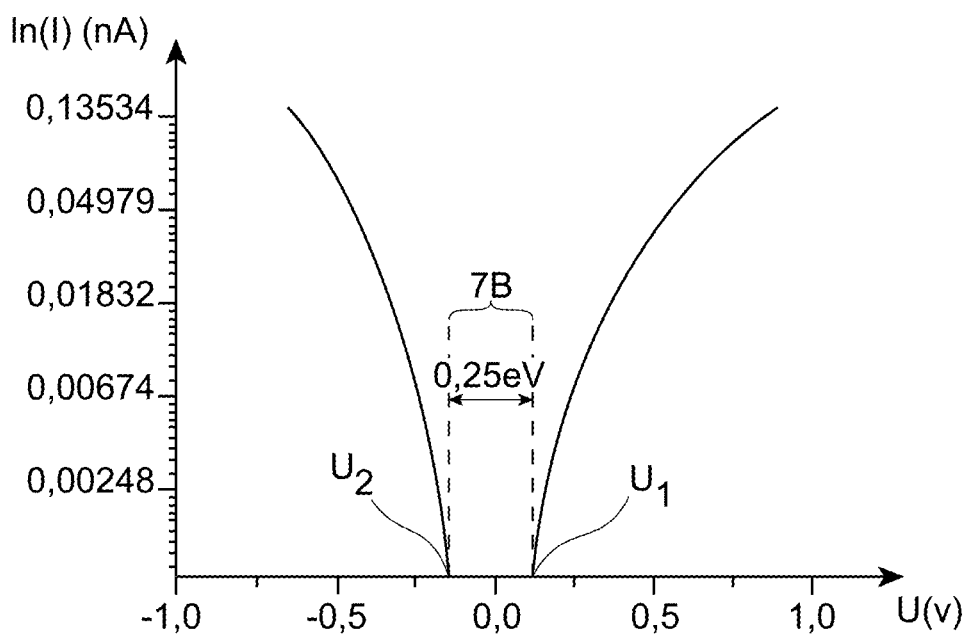

FIG. 3B shows a measurement obtained by STS of the band gap 7B of a modified graphene layer present in a structure according to a second particular embodiment of the invention. The band gap 7B, the difference between the smallest positive voltage U1 at which the current can pass and the smallest negative voltage U2 at which the current can pass, is measured approximately equal to 0.25 eV. The two structures described above according to the first and second embodiments of the invention, comprise a modified graphene layer present on a silicon face of an SiC substrate.

Figure 3C:
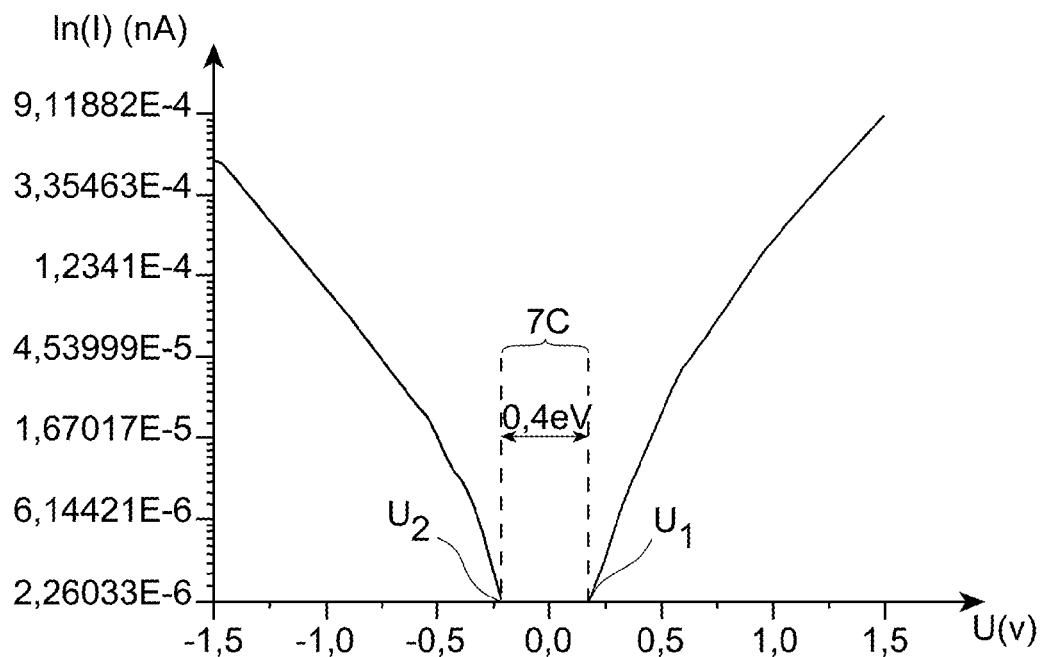

FIG. 3C shows a measurement obtained by STS of the band gap 7C of a modified graphene layer present in a structure according to a third particular embodiment of the invention. The band gap 7C, the difference between the smallest positive voltage U1 at which current passes and the smallest negative voltage U2 at which current passes, is measured to be equal to approximately 0.40 eV. This structure according to a third embodiment of the invention comprises a modified graphene layer present on a carbon face of an SiC substrate in which defects are present between the substrate and the modified graphene layer.

Figure 3D:
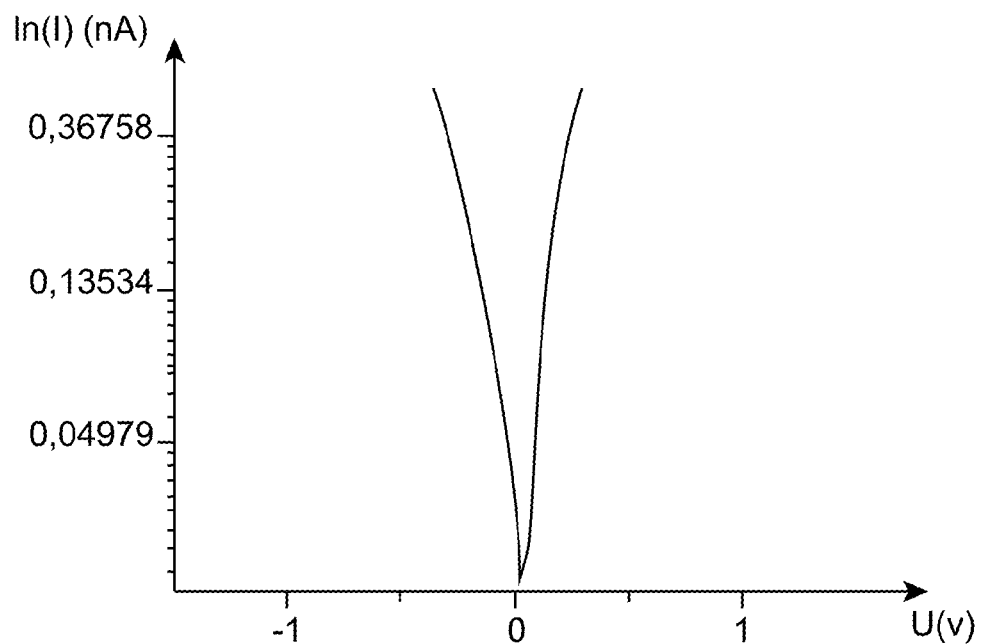

For comparison, the inventors measured the band gap by STS on a standard graphene layer present on the silicon face of an SiC substrate. FIG. 3D shows this measurement of the band gap of a standard epitaxied graphene layer. In this figure, an intensity is produced for any applied voltage U. Therefore, it is assumed that the band gap is zero.

In these figures, as in FIG. 3A, the Fermi level located at zero voltage is closer to the valency band than to the conducting band. Thus, within the scope of the invention, the modified graphene layer is advantageously of the «p» doped type.

Initially, a standard graphene layer, with no band gap or with almost no band gap formed on an SiC substrate, is strongly «n» doped due to the properties of the interface between the graphene layer and the SiC and the conventional methods for making a graphene layer. SiC is usually strongly «n» doped, and there is some diffusion of doping agents from SiC to the graphene layer.

This result can be observed for different modified graphene layers according to the invention.

The various structures in the invention, comprising a modified graphene layer with a different band gap, open the use of semiconducting graphene to various applications, each requiring a different opening band gap and all being capable of benefiting from the exceptional mobility properties of graphene, kept in a structure according to the invention.

The inventors made observations on the dispersion of electronic states in the modified graphene layer present in a structure according to the invention, to show that the electronic mobility of a standard graphene layer is kept in the modified graphene layer according to the invention. These observations were made using a measurement using the above-mentioned ARPES method.

In the ARPES or ARUPS method, photons are sent onto the surface of a sample, and in response, electrons called photoelectrons are «photo-emitted» with a given kinetic energy along a given direction. A measurement of the kinetic energy of the photoelectrons provides information about the electronic properties of the sample and particularly its surface. However, photoemission only measures occupied electronic states and not void electronic states, and in a semiconductor, the exploration is made mainly on states below the Fermi level, therefore the valency band. An inverse photoemission can be used to scan the conducting band. In some cases, if the Fermi level is located within the conducting band, the ARPES or ARUPS method can be used to display part of the conducting band located below the Fermi level.

A measurement of the direction along which the photoelectron is emitted from the surface of the sample provides means of knowing its atomic structure according to the photoelectron diffraction principle. This also identifies the dispersion of electronic states along the directions of the Brillouin zone, k, and can therefore help to determine the Fermi surface and the shape of the valency band, in a Dirac cone in the case of graphene.

This method of observing the position of the valency band in a modified graphene layer can be used in a synchrotron along any line of light or using an ultraviolet plasma discharge lamp and an analyser. For example, such an observation can be made with the SOLEIL synchrotron, particularly on lines of light called TEMPO or Cassiopee and using a SCIENTA analyser made by the VG-SCIENTA Company. However, the ARPES method is known to those skilled in the art.

Figure 4:
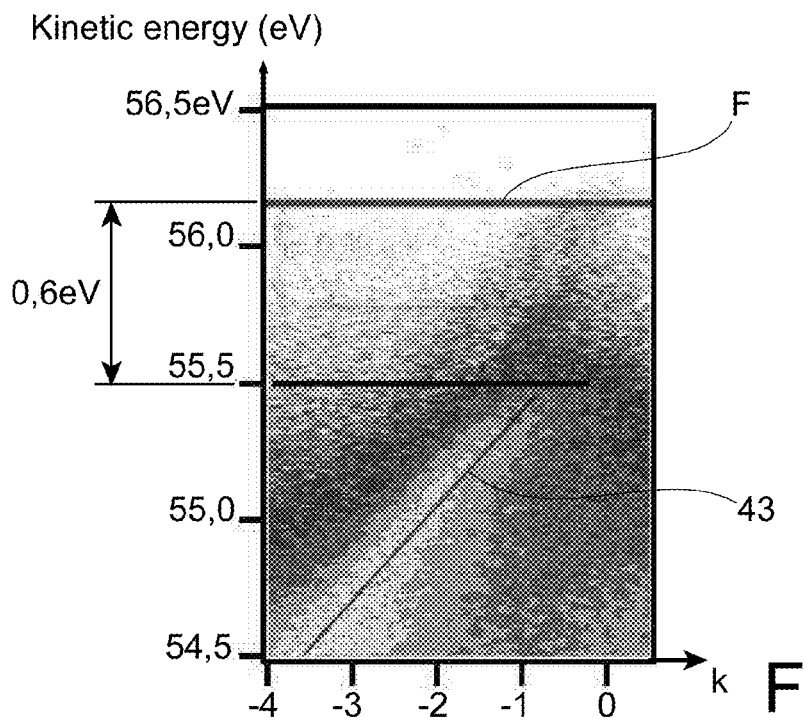
FIG. 4 shows a graph showing the density of electronic states obtained by ARPES observation.

FIG. 4 shows the results obtained when observing a structure according to the first embodiment of the invention using the ARPES method. Only half of the dispersion of electronic states of the modified graphene layer was measured; this is sufficient because there is always perfect symmetry in the valency band. Therefore an overview of the valency band and the conducting band can easily be deduced. In this figure, the abscissas show the variation of k, direction in the Brillouin zone, in the reciprocal lattice. The ordinates show the kinetic energy of photoelectrons. Two important items of information should be mentioned about the characteristics of the modified graphene layer:

firstly, it can be observed that the curve of the dispersion of electronic states 43 in a modified graphene layer according to the invention is entirely linear; no curvature is observed. This means that the valency band forms a perfect Dirac cone.

the Fermi level F can be identified in this figure taking account of the kinetic energy giving a white signal for all values of k. Secondly, the dispersion of electronic states 43 in the modified graphene layer is observed, separated from the Fermi level F by a value of 0.6 eV. The variations between this value and the value obtained by STS, described above, are due to a difference in the size of the analysed area for the two measurement methods. The ARPES method observes a larger area than the STS method and it includes points in the modified graphene layer that have different dopings or different band gap openings.

The substrate in a structure according to the invention may be an insulator but it is preferably a semiconductor and advantageously a wide band gap semiconductor. Semiconducting substrates are high quality, which is not necessarily the case for an insulator, making it possible to manufacture conventional microelectronic elements. Furthermore, unlike a small band gap semiconducting substrate, a wide band gap semiconducting substrate makes it possible for carriers to remain confined within the epitaxied graphene layer and not disperse in the substrate.

The substrate is preferably made of SiC. This is a very advantageous material; it is a wide band gap material; it also has high thermal conductivity and it is easy to form a standard graphene layer from SiC.

The substrate may be formed from any known polytype of SiC, and particularly one of the hexagonal, rhombohedric or cubic polytypes of SiC, for example 4H—SiC or 6H—SiC or 2H—SiC or 2C—SiC or 3C—SiC. Polytypes are known denominations that identify an organisation of the silicon and carbon planes inside a single SiC crystal. The substrate may also only comprise one SiC layer present on the surface of a main substrate composed mostly of another material, for example silicon.

In one structure according to the invention, modified graphene may be present on the carbon face or on the silicon face of the SiC substrate. This means that the plane directly below the modified graphene layer included in a crystalline lattice of SiC, is composed of carbon or silicon respectively. There is usually an angle rotation of 30° between the atomic lattice of the epitaxied graphene layer and the crystalline lattice of the SiC substrate. Such a rotation is not limitative for the invention.

Finally, all surface orientations can be used for a substrate according to the invention; for example surface types (0001), (000-1), (11-20), (1-102), (−110-2), (0-33-8), (1-100) for hexagonal polytypes and surface types (100), (110) or (111) for the SiC face-centred cubic polytype.

Figure 5A:
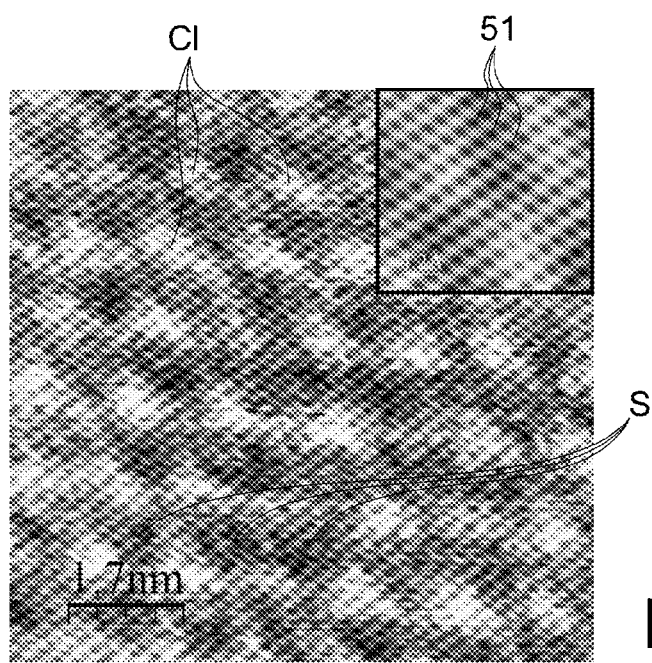
FIGS. 5A and 5B are maps obtained by STS of surfaces of graphene layers present on a substrate, an inset in each figure showing an enlargement of a part of each of the figures.

There are many electronic bonds between the substrate and the epitaxied graphene layer present on its surface in the case of standard epitaxied graphene. Advantageously, most of these electronic bonds have disappeared in a structure according to the invention. Thus, preferably, the structure according to the invention is such that the modified graphene layer is electronically decoupled from the substrate. FIGS. 5A and 5C show advantageously this characteristic of epitaxied graphene present on a structure according to the invention.

FIGS. 5A and 5C each show a map of the surface of an epitaxied graphene layer present on a substrate made of a 4H—SiC polytype of SiC. These maps were obtained by Scanning Tunneling Microscopy (STM). Scanning Tunneling Microscopy can observe a surface topology by measuring an electronic interaction between surface atoms and a scanning tunnelling tip. The inset in FIG. 5A shows an enlargement of a part of the map in FIG. 5A. This inset shows a « honeycomb » structure 51 with a hexagonal mesh characteristic of an epitaxied graphene layer on SiC. This FIG. 5A also shows an STM map outside the inset obtained by STM observation of a standard epitaxied graphene layer present on an SiC substrate, a regular moiré of light spots Cl and darker zones S. The regular moiré is a distinctive sign of an electronic interaction between two lattices of atoms with similar meshes but not superposed on each other. It is characteristic of standard graphene present on an SiC substrate.

Figure 5B:
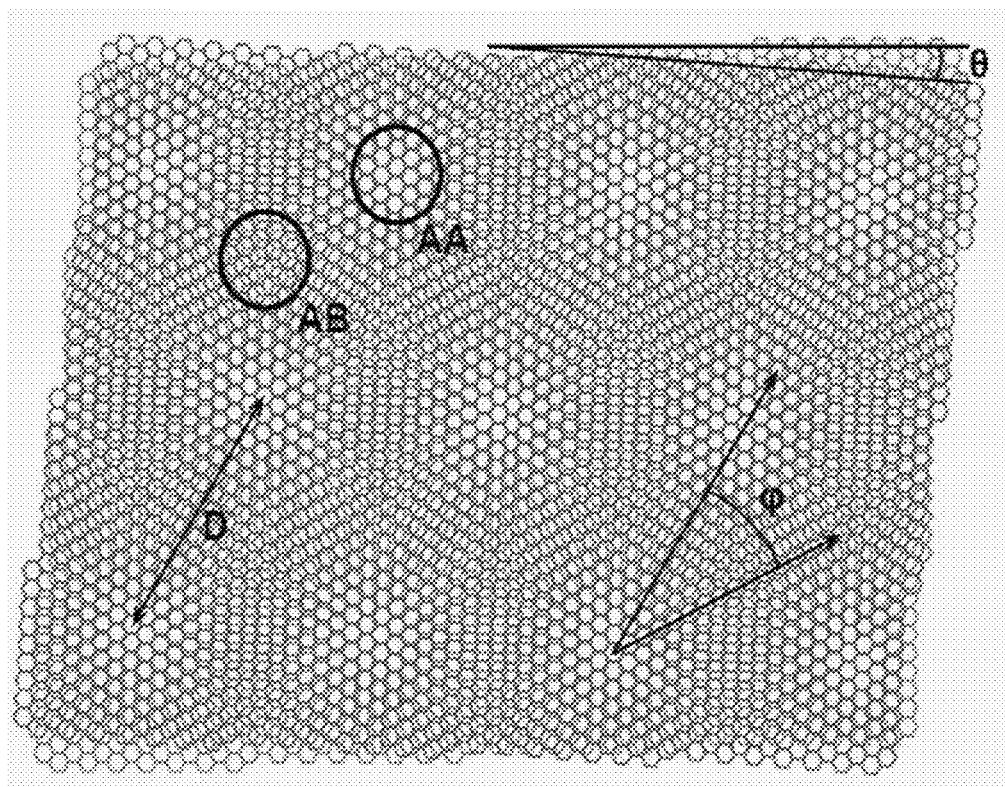
Figure 5C:
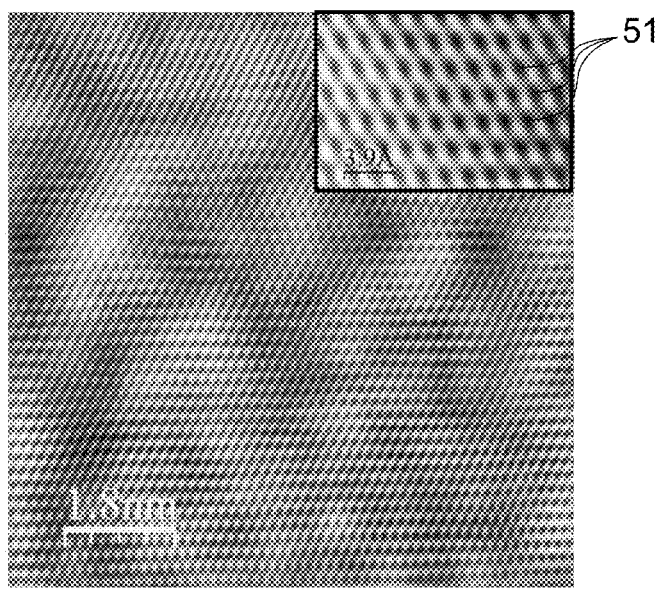
FIG. 5C is a diagram showing an interaction between two hexagonal lattices.

FIG. 5B originating from a document forming part of a thesis defended by Mr. François Varchon « Electronic and structural properties of graphene on silicon carbide », on Dec. 8, 2008, illustrates this phenomenon by representing the superposition of two hexagonal lattices with a misorientation relative to each other by an angle ☐. AA and AB are circles identifying one of the points in which the interaction between the lattices is strong that corresponds to a light spot Cl in FIG. 5A, and one of the points in which the interaction between the lattices is weaker, that corresponds to a darker zone S in FIG. 5A respectively. The result is then a period D between the points at which the interaction is strong and a half-angle ☐ defining symmetry in the moiré. Scanning tunnelling microscopy measures the electronic interaction between surface atoms and the probe and therefore a measurement using the STM method is affected by any electronic coupling between the surface composed of the graphene layer and the SiC substrate.

FIG. 5C is an STM map of a structure according to the first embodiment of the invention, comprising a modified graphene layer present on an SiC substrate, with a band gap measured by STS as being 1.3 eV. The inset in this figure clearly shows that there is a « honeycomb » lattice 11 made of hexagonal meshes identical to that observed in FIG. 5A for standard epitaxied graphene. Furthermore, FIG. 5C, outside the inset, does not include a regular moiré. All that can be seen are a few irregularities in intensity. The disappearance of the regular moiré indicates that there is no regular interaction between the modified graphene layer and the SiC substrate for a structure according to the invention. Since the substrate in the two observed structures is identical, rotation between the SiC crystalline lattice and the atomic lattice of the epitaxied graphene layer is identical. The lack of any regular moiré in FIG. 5C clearly shows that the modified graphene layer is almost electronically decoupled from the substrate.

Furthermore, as can be seen in FIG. 2, in a structure 201 according to the invention, there is preferably atomic hydrogen present in the form of hydrogen atoms called added hydrogen atoms H between the modified graphene layer 23 and the substrate 21. The added hydrogen atoms H, that may be protium ($^1$H isotope of hydrogen) or deuterium ($^2$H isotope of hydrogen) or a mix of these two isotopes, form a buffer plane comprising atomic hydrogen. Preferably, added hydrogen atoms H are bonded to atoms in the substrate 21 by chemical bonds 24 and some added hydrogen atoms H are placed where there would be electronic bonds between substrate 21 and the standard graphene layer, if it was not a modified graphene layer 23. Advantageously, the added hydrogen atoms H interact with few carbon atoms in the modified graphene layer. Advantageously, the buffer plane can electronically decouple the modified graphene layer from the substrate.

Figure 6A:
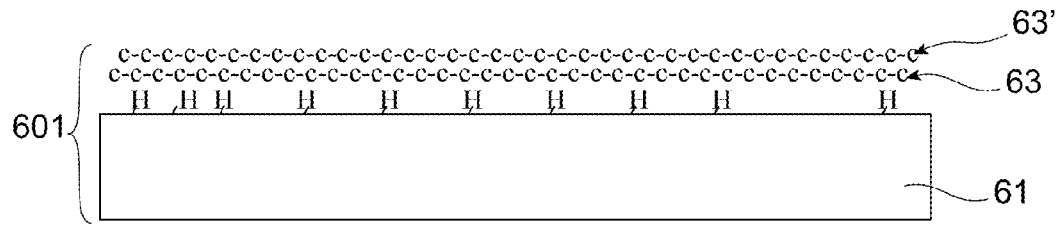
FIGS. 6A and 6B show modified structures according to the invention in which there are several modified graphene layers.

Finally, a structure 601 according to the invention may comprise a set of several layers 63, 63' of modified graphene, present on top of each other above the substrate 1 (FIG. 6A). The set of several modified epitaxied graphene layers 63, 63' according to the invention is semiconducting with an open band gap and has a linear dispersion of electronic states.

Therefore, it can be understood that the invention also relates to a structure comprising two modified graphene layers 63 and 63' above the substrate 61 (FIG. 6A). A first modified graphene layer 63 is made of semiconducting graphene with a band gap of the same order of magnitude as in the modified graphene layer present in the previously presented structure, for example between 0.25 eV and 1.8 eV and for example up to 1.3 eV. The first modified graphene layer 63 comprises a valency band in the form of a Dirac cone and is located between the substrate 61 and a second modified graphene layer 63'. The second modified graphene layer 63' may have an almost metallic behaviour for example with a zero band gap.

It can also be understood that the invention also relates to an alternative to the above-mentioned structure, comprising a third modified graphene layer 63" (FIG. 6B) in addition to the substrate 61, the first modified graphene layer 63 and the second modified graphene layer 63'. The third modified graphene layer 63" is inserted between the first modified graphene layer 63 and the second modified graphene layer 63'. The third modified graphene layer 63" is preferably made of semiconducting graphene with a valency band in the form of a Dirac cone. The third modified graphene layer 63" has a band gap that is preferably different from the band gap in the first modified graphene layer 63, and for example it may be smaller.

The various graphene layers are preferably electronically decoupled from each other.

Figure 7A:
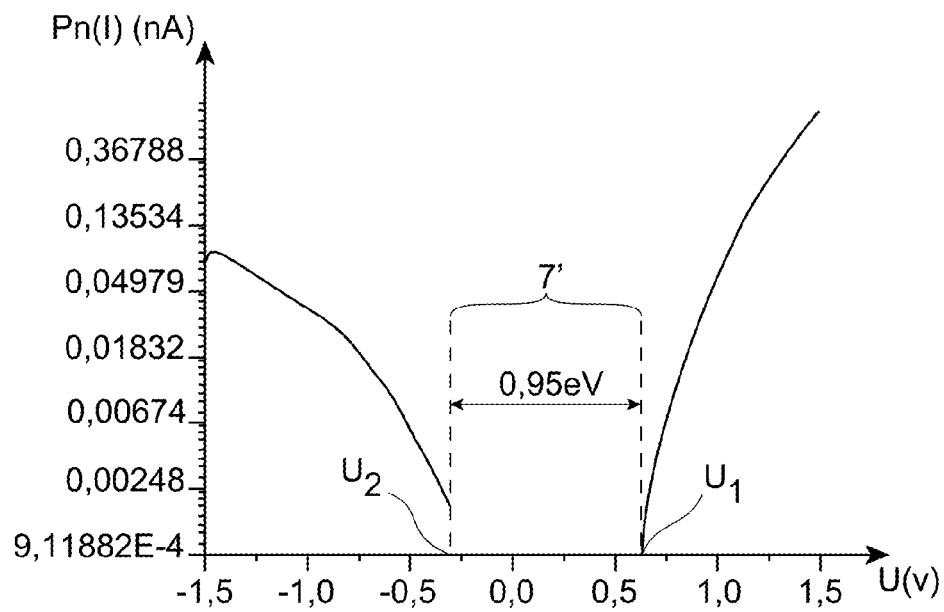
FIG. 7A is a graph showing the band gap measurement by STS in a modified structure according to the invention in which there are several modified graphene layers.

FIG. 7A shows an STS measurement of the graphene band gap 7' in a structure comprising two superposed layers of modified graphene present on the carbon face of an SiC substrate in a structure according to the invention, with no defects between the modified graphene layer and the substrate. It can be seen that the band gap 7' is open and has a value of approximately 0.95 eV. A measurable difference between 0.25 eV and 0.35 eV can be observed between the energy level of the valency band U2 and the Fermi level (zero abscissa). The various layers may be electronically decoupled from each other.

Figure 7B:
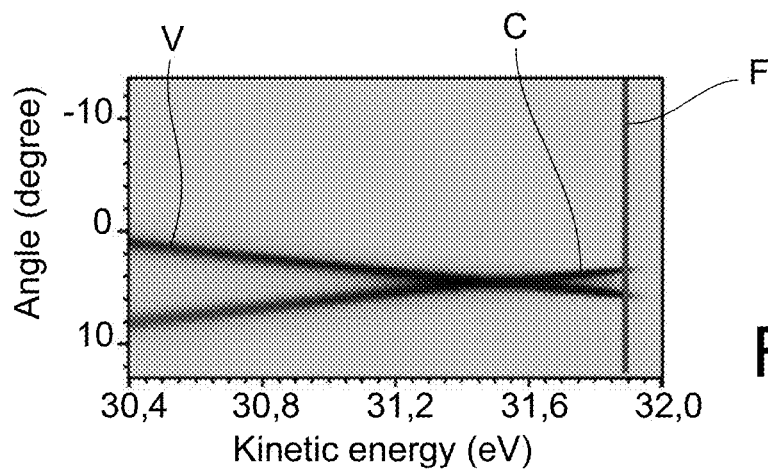
FIGS. 7B to 7D are graphs showing band gap measurements in graphene layers according to the state of the art and in structures comprising several modified graphene layers in each.
Figure 7C:
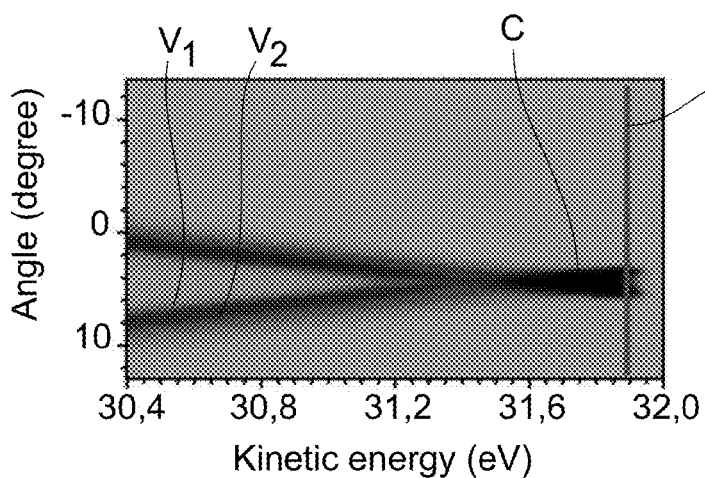
Figure 7D:
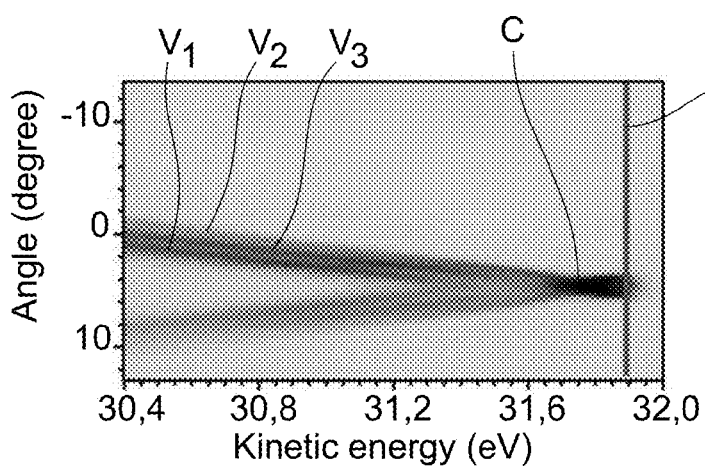

FIGS. 7B to 7D are figures obtained using the ARPES method and represent the shape of the valency band of structures comprising one or more graphene layers.

In these figures, the totality of the dispersion of electronic states was measured. This means that for a structure according to the state of the art (FIG. 7B) comprising a standard epitaxied graphene layer on an SiC substrate, there is an observed electronic dispersion in the form of an « X », the intersection of the "X" being to the left of the Fermi level F. The "X" shape indicates that the graphene layer comprises a valency band V and a conducting band C in contact or in quasi-contact.

This also shows that the valency band V is in the form of a Dirac cone; the electronic dispersion of the valency band V is measured in the form of two linear curves, starting from the lowest energies and moving towards higher energies, that intersect at higher energies without there being any curvature in either of the two curves.

FIG. 7C shows a measurement of the structure according to the invention illustrated in FIG. 6A using the ARPES method, and also measured in FIG. 7A using the STS method. This figure shows two valency bands V1 and V2 and a conducting cone C representing at least one conducting band. A first valency band is separated from the conducting bands C and is located at least 0.4 eV from the Fermi level F. This measurement agrees with the difference observed using the STS method, except for a few variations.

The first valency band V1 forming a Dirac cone clearly shows that the first modified graphene layer is made of semiconducting graphene and that the electronic mobility properties of standard graphene are kept. A second valency band V2 forms a Dirac cone located further to the right on the figure than the first valency band V1 and terminating in the conducting cone C. The result is that there is no separation between the valency band and the conducting band and that the second graphene layer has a metallic behaviour.

Figure 6B:
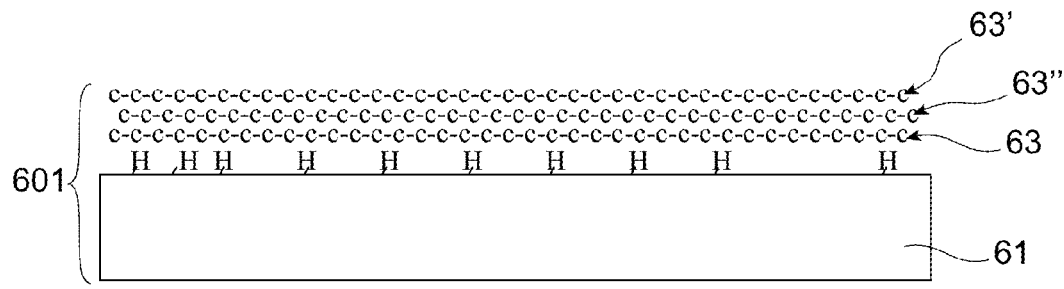

Finally, FIG. 7D shows a measurement of the structure according to the invention shown in FIG. 6B, using the ARPES method. A third valency band V3 in the form of a Dirac cone can be seen, located between the first and the second valency bands V1 and V2. The first valency band V1 is then clearly separated from the conducting cone C. The first valency band is located at 0.4 eV from the Fermi level F and the third valency band is approximately 0.2 eV from the Fermi level F. This means that the first and the third modified graphene layers are actually made of semiconducting graphene with different band gaps.

On these three FIGS. 7B to 7D, a difference can be seen between the valency bands and the Fermi level, rather than a band gap value directly, like that shown in FIG. 7A. In particular, FIG. 7A shows that the band gap is larger than the difference between the valency band and the Fermi level.

Secondly, the invention relates to a first advantageous embodiment of a method according to the invention. This first advantageous embodiment of the method can produce a structure according to the invention.

Figure 8A:
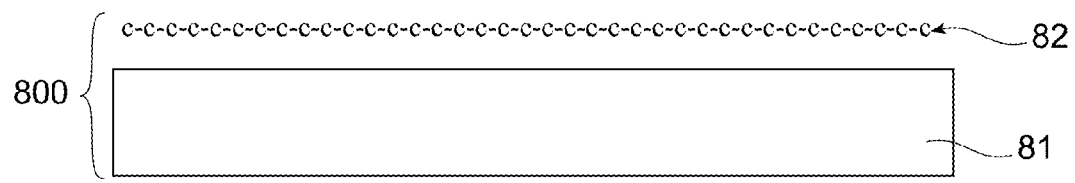
FIGS. 8A to 8C show steps in a method according to the invention to obtain a modified structure according to the invention.

The first advantageous embodiment of the method according to the invention comprises two major steps shown in FIGS. 8A to 8E:

firstly, an initial structure 800 comprising a standard graphene layer 82 present on a semiconducting or insulating substrate 81 has to be provided, like that shown in FIG. 8A. For simplification reasons, no physical bonds are shown between the standard graphene layer 82 and the substrate 81. However these bonds do exist.

The next step is to apply a hydrogenation step to the initial structure 800 on one side on which the standard graphene layer 82 is located.

This hydrogenation step may take place under an ultra-vacuum and an atomic hydrogen gas 85 is brought into contact with the initial structure 800. During this step, the initial structure 800 is exposed to atomic hydrogen gas 85 at an exposure dose of between 100 Langmuirs and 1100 Langmuirs. A langmuir is a gas dose measurement unit equal to $10^{-6}$ torr·s, namely 0.133 mPa·s. For example, exposure to a gas with an exposure dose equal to 1 langmuir may be done indifferently by exposure to a gas at a pressure of 0.001 mPa for 133 seconds or exposure to a gas at a pressure of 0.133 mPa for one second.

The hydrogenation step according to the invention advantageously takes place with an exposure dose of between 200 Langmuirs and 800 Langmuirs, or preferably with an exposure dose of between 200 Langmuirs and 500 Langmuirs.

Figure 8B:
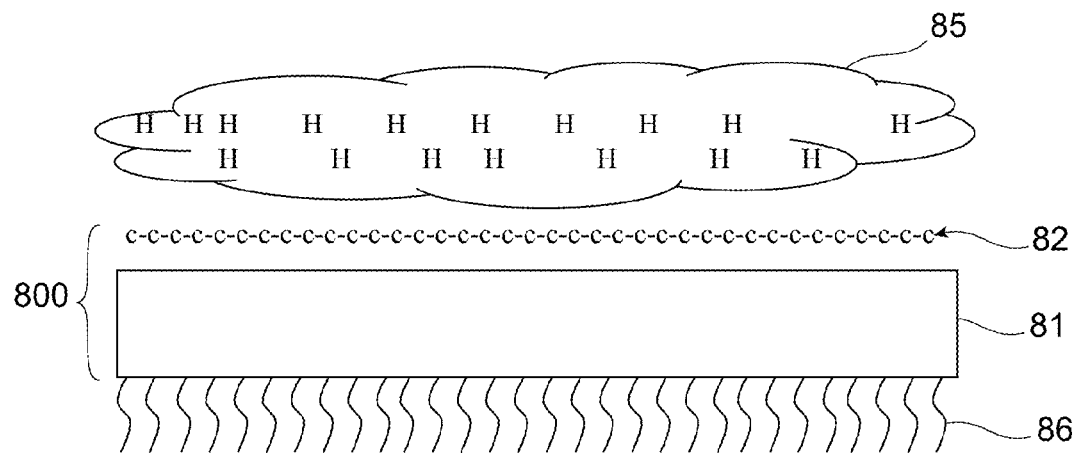
Figure 8C:
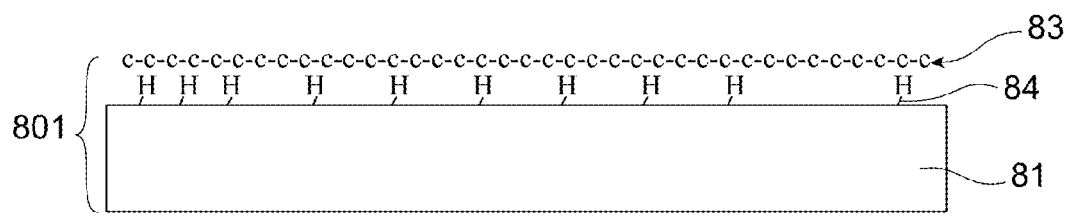
Figure 8D:
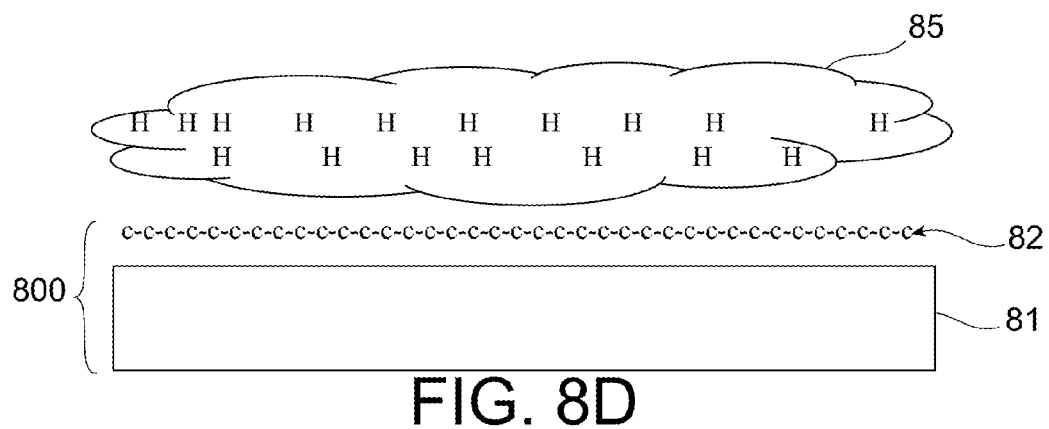
FIGS. 8D and 8E show variants of the method according to the invention.

During this step, as shown in FIG. 8B, added hydrogen atoms H composed of atomic hydrogen, are deposited on the initial structure 800 and then interact with it to form a modified graphene layer 83, shown in FIG. 8C, starting from the standard graphene layer 82. Thus, the result obtained is a modified structure 801.

Most added hydrogen atoms H create chemical bonds 84 with the substrate 81. The added hydrogen atoms H then advantageously form a buffer layer composed of atomic hydrogen between the substrate 81 and the modified graphene layer 83, during the hydrogenation step.

The modified graphene layer 83 according to the invention is a graphene layer with an open band gap with a value of between 0.25 eV, for example when the exposure dose is equal to 1100 Langmuirs, and 1.8 eV, or preferably between 0.25 eV and 1.5 eV.

In particular, if the exposure dose to the atomic hydrogen gas 85 is 500 Langmuirs, the band gap opening measured by STS is equal to approximately 1.3 eV if a single modified graphene layer 83 is present on the silicon face of an SiC substrate 81 or 0.95 eV if several modified graphene layers 83 are present on the carbon face of an SiC substrate 81. These two band gap values are such that the band gap value of the modified graphene layer(s) 83 is of the same order of magnitude as for silicon.

One particular example embodiment of the hydrogenation step is to use a hydrogen pressure of $10^{-7}$ Pascals for a duration sufficient to obtain the required dose, for example 100 minutes for a 500 Langmuir dose. This pressure has been used in an experimental reaction test set-up at CEA-Saclay to obtain above-mentioned band gap values at the above-mentioned exposure doses.

The inventors have observed that there is an optimum peak that will give a maximum band gap opening. If the exposure dose increases from 100 Langmuirs to 200 Langmuirs, the band gap in the modified graphene layer 83 increases. Furthermore, if the exposure dose is increased from 800 Langmuirs to 1100 Langmuirs, the band gap in the modified graphene layer 83 reduces. If a dose of 500 Langmuirs is applied between these values, the band gap in the modified graphene layer 83 is larger than for the two above-mentioned exposure doses. Therefore, the value of the band gap opening in the modified graphene layer 83 can be controlled by controlling the exposure dose to atomic hydrogen gas 85.

Therefore, there is a threshold exposure dose between 200 Langmuirs and 800 Langmuirs in which there is a maximum band gap opening in the modified graphene layer 83. This threshold exposure dose causing a maximum band gap opening is not an optimum embodiment for the method according to the invention.

A band gap opening is only optimal for a required application. Thus, if the required application requires a modified structure 801 with a band gap of approximately 0.25 eV or another required application requires a band gap close to 1.3 eV or 0.95 eV, the modified graphene layers 83 obtained by the method according to the invention that have band gaps with these values then have optimum band gap opening for the required applications. Some of these applications relate to the manufacture of transistors or diodes or other microelectronic or nanoelectronic devices. The method according to the invention can coordinate opening of the band gap in the modified graphene layer 83 to a predetermined application.

A heat treatment at a temperature between 200° C. and 400° C., preferably between 250° C. and 350° and for example close to 300° C. is applied to the added hydrogen atoms H so as to distribute the added hydrogen atoms H deposited on the initial structure 100 during the hydrogenation step uniformly between the modified graphene layer 83 and the substrate 81.

The heat treatment may be annealing of the structure done during the hydrogenation step and called hydrogenation annealing 86, as shown in FIG. 8B. Then the initial structure 800 comprising the substrate 81 and the standard graphene layer 82 is kept at the required temperature throughout the hydrogenation step, for example by means of a heating plate.

Figure 8E:
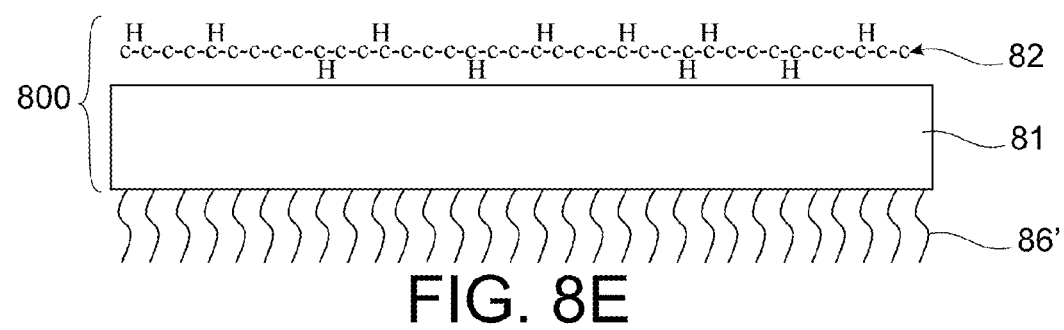

Alternately, the heat treatment may consist of annealing taking place after the hydrogenation step, and called post-hydrogenation annealing 86'. It may be done following a hydrogenation step at ambient temperature shown in FIG. 8D, identical to FIG. 8B apart from the lack of hydrogenation annealing 86. Then the initial structure 800 on which the added hydrogen atoms are present may be subjected to the above-mentioned post-hydrogenation annealing 86', as shown in FIG. 8E. The post-hydrogenation annealing 86' is at a temperature between 200° C. and 400° C., preferably between 250° C. and 350° and in particular close to 300° C., and lasts for a few minutes, for example between one minute and 20 minutes and advantageously five minutes. For example, it may be done in a furnace or in a reaction chamber in which hydrogenation takes place.

Also alternately, post-hydrogenation annealing 86' may be done in addition to the hydrogenation step comprising a hydrogenation annealing 86 as shown in FIG. 8B.

The purpose of the hydrogenation annealing 86 and the post-hydrogenation annealing 86' is to facilitate the diffusion of added hydrogen atoms H through the standard graphene layer 82 towards the substrate 81. Another purpose is to enable a uniform distribution of added hydrogen atoms H on the substrate 81 and thus have an approximately constant density of added hydrogen atoms H on the substrate 81. These annealings are not necessary to open the band gap in the modified graphene layer, but they are necessary to obtain a uniform band gap opening over the entire layer. Lack of annealing can help to obtain a variation in the opening of the band gap on the surface of the structure, some points having a first band gap value and other points having other band gap values.

The atomic hydrogen H used during the hydrogenation step is preferably formed by dissociation of dihydrogen by a tungsten filament heated to high temperature, for example of the order of 1400° C. or 2000° C. or more than 2000° C., the filament advantageously being located at a short distance from the initial structure 800. For example, the tungsten filament used may have a diameter of 0.25 mm and it may carry a current of 3.7 A so as to reach the required temperature.

Alternately, atomic hydrogen gas 85 can be formed by means of a cold plasma. In this case, there is no hydrogenation annealing 86 and post-hydrogenation annealing 86' is compulsorily applied.

Preferably, as for the structure according to the invention, the substrate 81 is made of SiC, particularly one of the polytypes mentioned above and the standard graphene layer 82 may be present on any type of SiC surface orientation.

Similarly, the modified graphene layer 3 may alternately be present on the silicon face or the carbon face of the SiC substrate 81.

The hydrogenation described above takes place in a reaction chamber with a given shape of test set-up. The relation between exposure doses and the band gap opening in the modified graphene layer 83 can vary depending on the shape of the test set-up and depending on the pressure used and the polytype of SiC used. However, an increase in the exposure dose of an initial structure according to the invention starting from 100 Langmuirs, successively induces:

opening of the band gap;
reaching a maximum band gap opening;
and finally a reduction in the band gap opening.

This observation remains true for all test set-up shapes, all SiC polytypes and for all atomic hydrogen gas pressures used. Those skilled in the art will know how to do the tests necessary to calibrate the method according to the invention as a function of the special features of the reaction chamber that they use and the SiC polytype used.

The inventors have demonstrated one special example illustrating this. They used a hydrogen pressure of $10^{-6}$ Pascals for long enough to obtain the required dose, for example 10 minutes for a dose of 500 Langmuirs in an experimental reaction test set-up located in the SOLEIL Synchrotron. The structure obtained is that previously shown in FIGS. 6A and 7B with two modified graphene layers, one of which has a band gap. This result will be commented upon in more detail later.

Figure 9A:
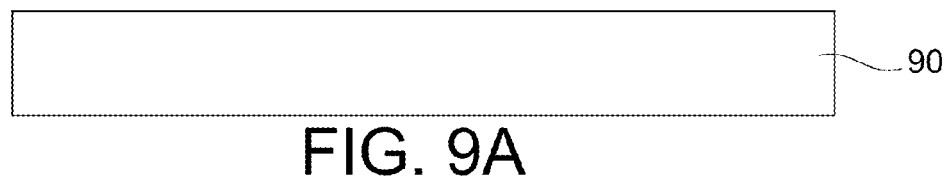
FIGS. 9A to 9C show a first advantageous embodiment of a method according to the invention, this embodiment also supplying an alternative initial structure before the method according to the invention is started.
Figure 9B:
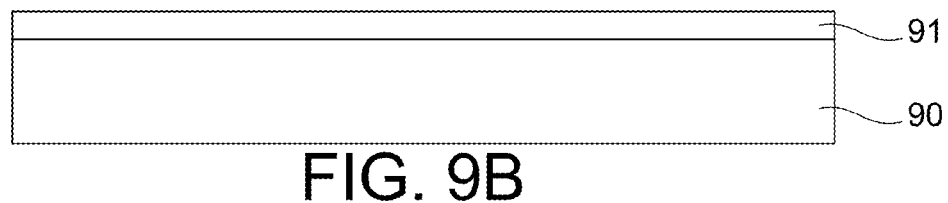
Figure 9C:
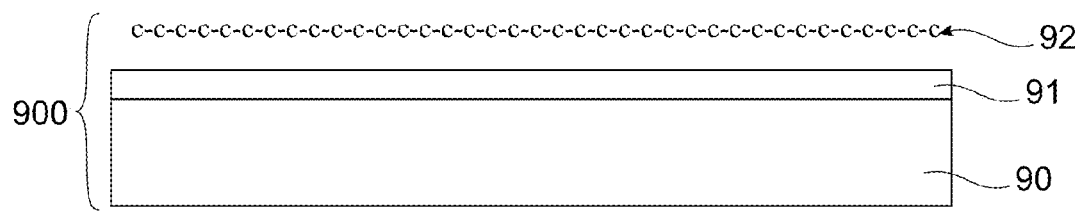

In one method according to the invention, the substrate 81 may be made of 3C—SiC, in other words the SiC has a centred face cubic mesh with instead of a hexagonal mesh. In this case, it may be advantageous if the 3C—SiC substrate 81 were manufactured from a conventional silicon substrate. This means that the initial structure 800 comprising a standard graphene layer 82 on an SiC substrate 801 is then advantageously manufactured using the following steps:

supply of a silicon substrate 90 (FIG. 9A),
sublimation and/or conventional carbonation of silicon present on the substrate surface at between 1200° C. and 1300° C., to obtain at least one surface layer 91 made of SiC (FIG. 9B) above the silicon substrate 90, or the formation of SiC by any other known method such as an ultravacuum furnace, sublimation of a neutral gas under pressure, etc.;

formation of a standard graphene layer 92 on the surface layer 91 made of SiC present on the silicon substrate 90 so as to form an initial structure 900 according to the invention (FIG. 9C).

The silicon substrate 90 and therefore the surface layer 91 made of SiC may have a (100), (110) or (111) orientation.

Such a method is advantageous because it is easy to obtain large silicon substrates 90. Therefore it is possible and relatively easy to produce substrates covered with a large high quality SiC surface layer 91. It then becomes relatively easy to use modified epitaxied graphene in microelectronics.

If the exposure dose is higher, for example between 1300 Langmuirs and 2500 Langmuirs or more than 2000 Langmuirs, possibly up to 4000 Langmuirs or 5000 Langmuirs, the band gap closes relative to the band gap obtained in the first advantageous embodiment of the method according to the invention and the modified graphene layer becomes almost metallic. Obviously, the dose values given in the examples are applicable for the above-mentioned experimental CEA-Saclay test set-up. Those skilled in the art working with another test set-up should be able to calibrate it and modify the method accordingly.

Figure 12A:
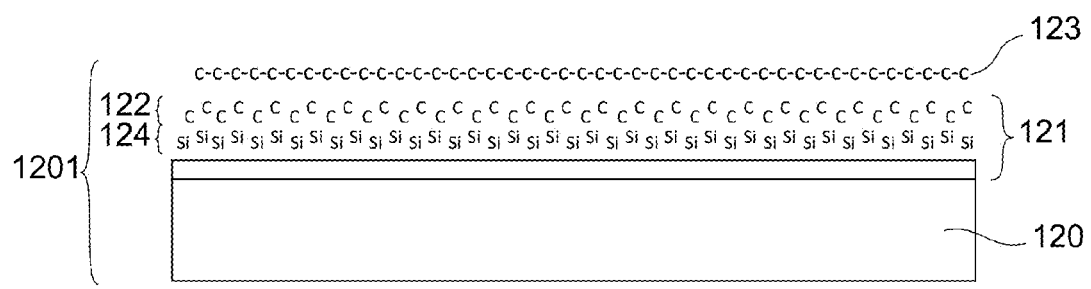
FIGS. 12A to 12C show the second advantageous embodiment of the method according to the invention.
Figure 12B:
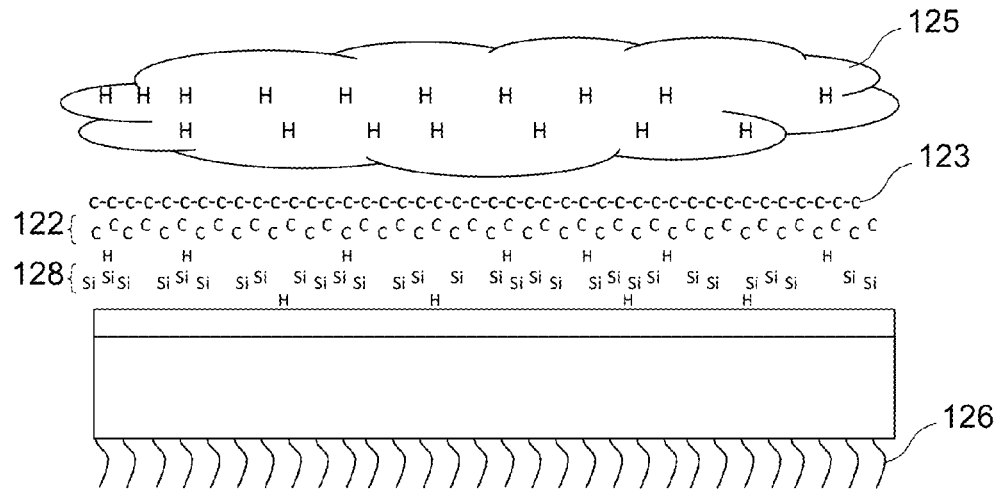
Figure 12C:
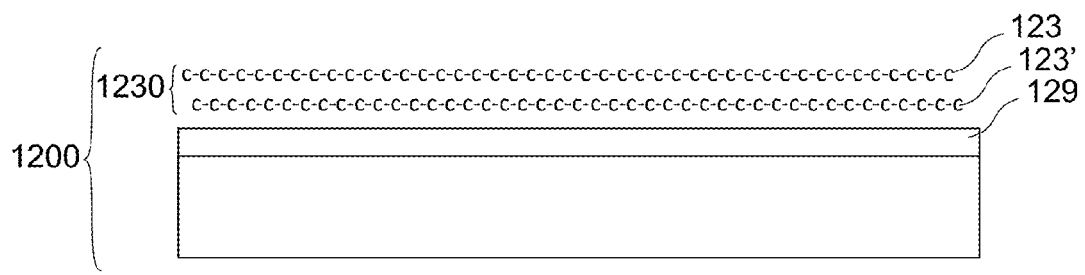

Therefore, the invention also relates to a second advantageous embodiment of the method according to the invention, shown in FIGS. 12A to 12C. This second advantageous embodiment of the method according to the invention is a variant of the first advantageous embodiment of the method according to the invention in which exposure doses to hydrogen gas are different.

When an initial structure 1201 according to the invention comprises at least one initial graphene layer 123 located on an SiC surface layer 121 as shown in FIG. 12A, there is a last plane of carbon atoms called the carbon plane 122 of the SiC substrate (also called "buffer layer") located immediately under the initial graphene layer 123.

If the initial graphene layer 123 is present on a carbon face of the SiC substrate, as shown in this case, the last carbon plane 122 may be located above a last plane of silicon atoms called the last silicon plane 124. Conversely, if the initial graphene layer 123 is on a silicon face of the SiC substrate, the last carbon plane may be located under a last silicon plane 124, the last silicon plane 124 being between the graphene layer 123 and the last carbon plane 122.

As mentioned above, the initial structure 1201 may comprise an SiC surface layer 121 present on a substrate 120 made of any other material compatible with the manufacture of the SiC surface layer 121. Alternately, the substrate 120 may also be made of SiC. In this case, there is no difference between the surface layer 121 and the substrate 120.

If hydrogenation 125 shown in FIG. 12B is done at a higher exposure dose, for example between 1300 Langmuirs and 4000 Langmuirs, added hydrogen atoms H penetrate under the initial graphene layer 123 and form a buffer of added hydrogen atoms H. This buffer, during annealing 126 according to the invention, decouples the last carbon plane 122 in the SiC substrate from the substrate and evacuates some of the silicon atoms from the last silicon plane 128.

Hydrogenation, followed by annealing, results in the formation of an additional graphene layer 123' starting from the last carbon plane 122 (FIG. 12C). Therefore, the end result is a final structure 1200 comprising a substrate 120, an SiC surface layer 129 from which at least one carbon plane and part of a silicon plane that were on the initial structure 1201 have been removed, and a double modified graphene layer 1230 that may extend over the entire substrate 120, and particularly over the entire SiC surface layer 129.

Preferably, hydrogenation done in this embodiment of the method according to the invention imposes a hydrogen gas exposure dose of between 1500 Langmuirs and 2500 Langmuirs, for example 2000 Langmuirs or 2200 Langmuirs, or more than 2500 Langmuirs, on the initial structure 1201. Therefore the dose can be as high as 4000 Langmuirs or 5000 Langmuirs.

In particular, as mentioned above, the exposure doses necessary to achieve an identical result can vary depending on the test set-up. The structure for which the band gap was measured in FIG. 7A was obtained with the above-mentioned CEA Grenoble test set-up and an exposure dose of 2200 Langmuirs. The structure for which the band gap was measured in FIG. 7C, as mentioned above, was obtained with the above-mentioned SOLEIL test set-up, with an exposure dose of 500 Langmuirs. Therefore, there is a factor of about 4.4 between the effect of the doses from these two test set-ups.

The structure shown in FIGS. 6B and 7D was obtained by means of a method according to the invention with an exposure dose of 1000 Langmuirs, in the SOLEIL test set-up, at a pressure of $10^{-6}$ Pa. This means that an exposure dose of 4400 Langmuirs would be necessary for the same result as with the CEA test set-up.

Other modified graphene layers may be formed if the dose is increased further at a pressure between approximately $10^{-5}$ Pa and $10^{-8}$ Pa, for example fourth and fifth graphene layers starting from the carbon planes of the SiC substrate. Some of the modified graphene layers are then semiconducting according to the invention.

In the same way as in the first advantageous embodiment of the method according to the invention, annealing 126 mentioned above may be hydrogenation annealing and/or post hydrogenation annealing. Therefore, it can be done during hydrogenation and/or after hydrogenation respectively Annealing is done at a temperature between 200° C. and 400° C., preferably between 250° C. and 350° and particularly close to 300° C. Post-hydrogenation annealing, if it is done, preferably lasts for a few minutes, for example between one minute and 20 minutes, and advantageously five minutes. It may for example take place in a furnace or in a reaction chamber in which hydrogenation takes place.

When a new modified graphene layer is made, a new carbon plane and a new silicon plane are defined as being the last carbon plane and the last silicon plane.

Thus, either by repeating this method described in FIGS. 12A to 12C or by increasing the exposure dose to hydrogen gas and possibly annealing over a longer period, it is once again possible to disorganise the silicon atoms forming the last silicon plane and decouple the last carbon plane. A third modified graphene layer is then formed on a substrate 1201 comprising at least one SiC surface layer 121, 129 on the surface of which a new carbon plane and a new silicon plane are defined as being the last carbon plane and the last silicon plane.

According to the invention, in carrying out hydrogenation at low pressure between $10^{-5}$ Pa and $10^{-8}$ Pa, preferably comprising or followed by hydrogenation annealing and/or post-hydrogenation annealing as described above, a hydrogenation cycle of a graphene layer can be observed with increasing exposure doses.

Starting from an initial structure comprising an initial epitaxied graphene layer made of standard graphene, a first hydrogenation cycle of a graphene layer can be observed:

opening of the band gap in the initial graphene layer, obtaining a maximum band gap,
closing the band gap,
the initial graphene layer acquires an almost metallic behaviour.

If the exposure dose is increased even further, a mechanism for the creation of a new modified graphene layer is observed between the initial graphene layer and the substrate. The band gap of the new modified graphene layer also varies as a function of a second graphene layer hydrogenation cycle similar to the first cycle. However, the values of exposure doses of the second graphene layer hydrogenation cycle are calculated starting from the formation of the new modified graphene layer that can be different from values of exposure doses in the first cycle.

However, since the new graphene layer is not epitaxied, a third modified graphene layer may be formed before the end of the above-mentioned second cycle. The third modified graphene layer also has a band gap that varies as a function of a third graphene layer hydrogenation cycle similar to the second cycle. Once again, values of exposure doses calculated from the formation of the third graphene layer may be different from those in the second cycle.

This can occur many times by further increasing the dose, the graphene layers furthest from the substrate obtaining an almost metallic behaviour as time goes on, and new graphene layers being formed initially with a zero band gap, and then as semiconducting graphene layers as the exposure dose increases.

Therefore, it can be understood that the first advantageous embodiment of the invention is aimed at obtaining a semiconducting graphene layer by forming a band gap in an initial graphene layer, following the first hydrogenation cycle of a graphene layer. It is also understood that the second advantageous embodiment of the method according to the invention is aimed at obtaining a semiconducting graphene layer by the creation of one or several new modified graphene layers. Therefore, at least one of the new modified graphene layers is made of semiconducting graphene.

If it is desired to perform a method according to the invention in several steps, a total exposure dose perceived by the structure has to be allowed for, together with any desorptions.

Figure 11:
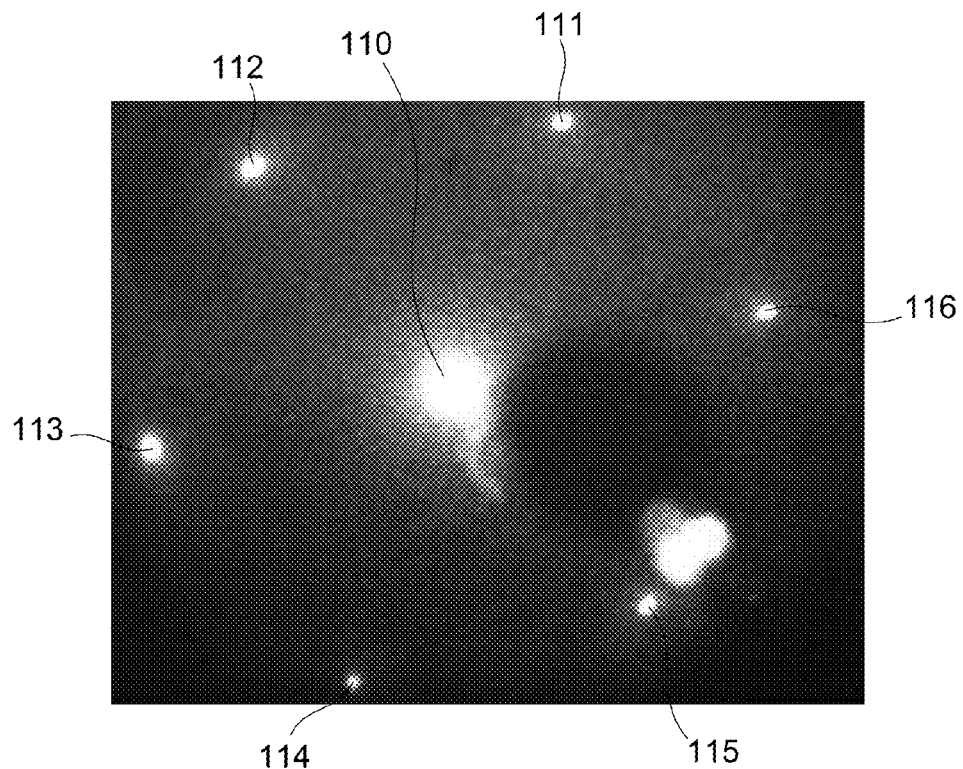
FIG. 11 shows a diffraction measurement of low energy electrons in a structure that has been subjected to an exposure dose characteristic of a second advantageous embodiment of the method according to the invention.

The formation of a double layer of modified graphene using the second advantageous embodiment of the method according to the invention is confirmed by an observation using Low Energy Electron Diffraction (LEED), shown in FIG. 11. This figure shows the central emission spot 110 and six peripheral spots 111 to 116. If there had been a rotation of 30° as in the case of a standard graphene layer on an SiC substrate, these peripheral spots would all have at least one 6√3×6√3 satellite spot. Since there is no 6√3×6√3 satellite, this means that there are no signs of a graphene layer misoriented by a 30° rotation from the SiC crystalline lattice. Since the initial graphene layer was misoriented by 30° from the substrate, this means that there is a new graphene layer. Therefore the double layer of modified graphene has a low energy electron diffraction structure which does not have a 6√3×6√3 satellite.

Thus, there is at least one graphene layer that does not have any rotation with the SiC crystalline lattice and therefore a graphene layer has been formed from the last carbon plane. This clearly shows decoupling by the added hydrogen atoms H positioned between the last carbon plane and the SiC substrate. Furthermore, this is confirmed by the fact that this double layer has a closed band gap.

Therefore in this case, the double layer has become practically metallic, or semiconducting with a zero band gap. This is very interesting because it is very difficult to make a uniform double graphene layer over a large area.

This figure clearly shows that if the dose in the first advantageous embodiment of the method according to the invention is increased, for example up to 2000 Langmuirs or more as described above, it is therefore possible to obtain a double layer of modified epitaxied graphene of which at least one graphene layer is almost metallic and at least one graphene layer is made of semiconducting graphene or even a superposition of several layers of epitaxied graphene, for example more than two modified graphene layers, starting from a monolayer of epitaxied graphene. This double layer has a weak interaction with the SiC substrate because there is a perfect match between the lattice in the graphene layer and the crystalline lattice in the SiC substrate.

In other words, the new modified graphene layer 123' has an interface with the new surface layer 129 made of SiC with almost no defects. Since the new modified graphene layer 123' is derived from the last carbon plane 122 of the surface layer 121, there is an almost perfect alignment between a crystalline lattice characteristic of the new modified graphene layer 123' and a crystalline lattice characteristic of the new surface layer 129.

The references used in the cases below refer to FIGS. 8A to 8C.

Figure 10:
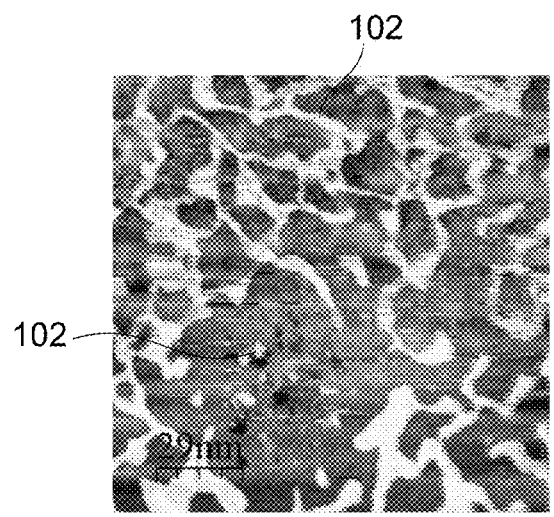
FIG. 10 shows a map of an initial structure comprising critical defects, obtained by STM.

The first advantageous embodiment of the method for manufacturing a structure comprising a modified graphene layer present on a substrate may also be used with an imperfect initial structure like that shown in FIG. 10, reproducing an STM observation of such a structure. In particular, the method according to the invention can be applied if there are any existing critical defects 102 between the SiC substrate and the modified graphene layer.

Surface defects in the SiC substrate do not cause any reduction of mobility in standard epitaxied graphene, or in a modified graphene layer. Therefore, these defects will not be critical.

However, critical defects 102 might be present. In particular, these defects may be electron traps. They reduce the mobility of electrons in the standard graphene layer using pendant bonds. They may comprise ends of carbon nanotubes or carbonated chains with pendant bonds that create interface states that deform the shape of the Dirac cone of the valency band of the standard epitaxied graphene layer. This situation is generally fairly frequent at the interface between a substrate and a graphene layer obtained according to conventional methods.

The use of the first advantageous embodiment of the method according to the invention on this type of structure with a reduced mobility of electrons in the standard epitaxied graphene layer, can be used to obtain a semiconducting modified graphene layer and passivate the critical defects. The shape of the valency band is once again like a Dirac cone. Thus, the high mobility of electrons is found once again after a method according to the invention.

Another possible application of the first advantageous embodiment of the method according to the invention is to choose an initial structure 800 in which the standard graphene layer 82 has been oxidised before the hydrogenation step according to the invention, so as to open up the band gap in the standard graphene layer 82. Thus as presented above, such an oxidation results in the formation of electron traps inducing a curvature in the dispersion of electronic states and therefore reduced mobility of electrons in the standard graphene layer 82.

Application of the method according to the invention to such an initial structure 800 is a means of modifying the opening of the band gap obtained by the oxidation step and passivating the electron traps. The modified graphene layer 83 is then such that the dispersion of electronic states is linear and therefore the modified graphene layer 83 has the same mobility as a standard defect-free graphene layer 82.

The initial structure 800 of a method according to the invention may comprise several superposed modified epitaxied graphene layers 83. After application of the method according to the invention, it can be seen that the band gap is open and its value is close to 0.95 eV.

The special cases of applications of the method according to the invention presented above in relation to the first advantageous embodiment of a method according to the invention, are applicable to the second advantageous embodiment of a method according to the invention that recommends the use of an exposure dose of between 1500 Langmuirs and 2500 Langmuirs or more than 2500 Langmuirs. However, since these special cases are described in the framework of obtaining a structure comprising a semiconducting modified graphene layer, this part of the description should disclose a double modified graphene layer rather than a semiconducting modified graphene layer. Thus, if there were any critical defects in the standard graphene layer present in the initial structure reducing the electron mobility in this said standard graphene layer, then these critical defects are passivated by the hydrogenation step.

Like the first embodiment of the method according to the invention, the second embodiment can be used to obtain a modified graphene layer and to passivate most critical defects that might be present between the initial graphene layer and the SiC surface layer 121. The valency band has the shape of a Dirac cone again. Thus, the high mobility of the electrons is renewed after a method according to the invention according to any one of the advantageous embodiments.

Figure 13A:
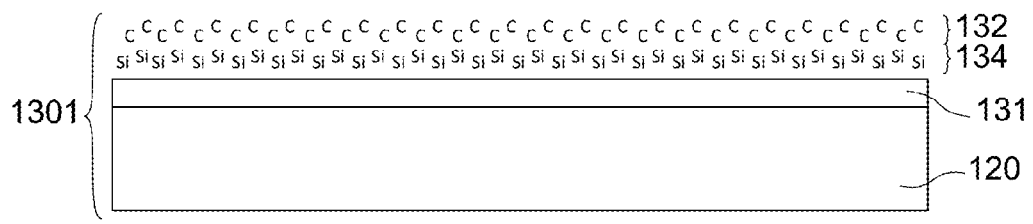
FIGS. 13A to 13C show a third advantageous embodiment of the method according to the invention.
Figure 13B:
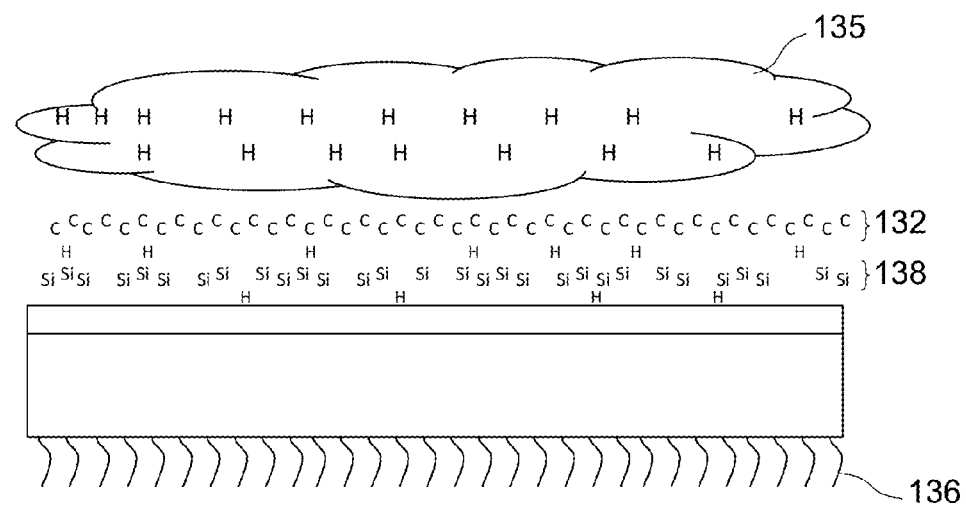
Figure 13C:
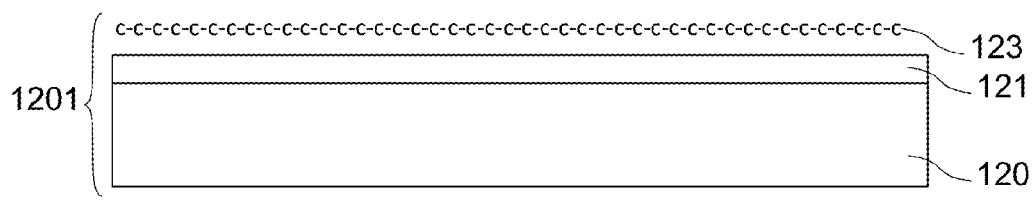

Similarly, the inventors have extrapolated from the mechanisms involved in the second embodiment of the method according to the invention to disclose a third embodiment of the method according to the invention, shown in FIGS. 13A to 13C.

The first and second advantageous embodiments of the method according to the invention require an initial structure comprising at least one substrate on which an initial epitaxied graphene layer is present on the surface.

The inventors propose the third advantageous embodiment of the method according to the invention which eliminates this need in order to obtain a structure comprising a semiconducting modified graphene layer.

Firstly, an initial structure 1301 is chosen comprising at least one silicon carbide SiC layer without any initial epitaxied graphene layer. The silicon carbide layer may be SiC with silicon face or carbon face, like the layer shown in FIG. 13A. This layer may be itself an independent substrate or it may be a surface layer 131 present on a substrate 120 made of another material, for example silicon. There are two last atomic planes on a free surface of this layer; a the last carbon plane 132 and a last silicon plane 134. The last atomic plane will be the last carbon plane 132 or the last silicon plane 134 depending on whether the carbon face or silicon face respectively of the surface layer 131 is exposed.

Hydrogenation 135 and heat treatment 136 are applied on the free surface and the last two atomic planes mentioned above, under operating conditions similar to the second advantageous embodiment of a method according to the invention described above (FIG. 13B). In particular, hydrogenation is preferably done with a hydrogen gas exposure dose between 1500 Langmuirs and 2500 Langmuirs or more than 2500 Langmuirs, for example 2000 Langmuirs or 2200 Langmuirs or 3000 Langmuirs. These values should be considered under pressure conditions equal to $10^{-7}$ Pa in the CEA's experimental test set-ups. If the hydrogen pressure is changed and the test set-up is changed, those skilled in the art will make adjustments to the above mentioned values and for example will use an exposure dose that could be as high as 4000 Langmuirs or 5000 Langmuirs.

In the same way as described in the first and the second advantageous embodiments of the method according to the invention, the heat treatment 136 mentioned above may be a hydrogenation annealing and/or a post-hydrogenation annealing. Therefore, it may be done during and/or after hydrogenation. The temperature of the annealing operation(s) is between 200° C. and 400° C., preferably between 250° C. and 350° and particularly close to 300° C., and the duration is a few minutes, for example between one minute and 20 minutes and advantageously five minutes. For example, annealing may be done in a furnace.

The added hydrogen atoms H then penetrate under the last carbon plane 132 forming a buffer plane of added hydrogen atoms H and decoupling the last carbon plane from the surface layer 131. Furthermore, the hydrogen atoms may be evacuated or may disorganise part of the last silicon plane 138.

This forms an additional graphene layer 123 from the last carbon plane 132 (FIG. 13C). Therefore the result obtained is a new structure 1201 comprising a substrate 120, an SiC surface layer 121 from which at least one carbon plane and at least part of a silicon plane have been removed from the initial structure 1301 and a modified graphene layer 123 that can extend over the entire substrate 120 and over the entire SiC surface layer 121.

Being on the surface, this modified graphene layer 123 behaves as if the graphene were significantly p doped.

Thus, exposure of an initial SiC substrate without an initial graphene layer on the surface to a hydrogenation step according to the invention can decouple the last carbon plane from the SiC surface to form a single modified graphene layer electronically decoupled from the substrate.

Starting from this new structure, the exposure dose can be increased to form several superposed modified graphene layers under the previously obtained modified graphene layer by applying the information derived from hydrogenation cycles of a graphene layer presented in the description of the second advantageous embodiment of the method according to the invention.

This increase in the exposure dose may be made during the hydrogenation step in the third advantageous embodiment or it may be done in an additional step. Exposure doses to hydrogen that would then have to be used should be evaluated as a function of the structure and the pressures used.

In each embodiment of the method according to the invention, hydrogenation can be done by means of any hydrogen isotope or even with a gaseous mix of the different hydrogen isotopes. In particular, protium ($^1$H) or deuterium ($^2$H) or a gaseous mix of protium and deuterium can be used.

DOCUMENTS QUOTED

1—X. Wu, M. Sprinkle, X. Li, F. Ming, C. Berger, W. A. of Heer, Phys. Rev. Lett. 101. 026801 (2008)
2—D. C. Elias et al., Science 323, 610 (2009)
3—R. Balog et al., ACSIN-10. Granada, Spain, Sep. 21-25, 2009, published as R. Balog et al., Nature Materials 9, 315 (April 2010)
4—A. Bostwick et al., arXiv: 0904.2249 (2009)

5—N. P. Guisinger, G. M. Rutter, J. N. Crain, Ph. N. First, J. A. Stroscio, NanoLett. 9, 1462 (2009)

The invention claimed is:

1. Method of manufacturing a structure comprising at least one modified semiconducting graphene layer, the modified graphene layer comprising a band gap between 0.2 eV and 1.8 eV, measured by scanning tunneling spectroscopy, and with a dispersion of electronic states, observed by Angle Resolved PhotoEmission Spectroscopy (ARPES or ARUPS), the dispersion of electronic states being either a valency band forming a Dirac cone or a linear dispersion of electronic states, the modified graphene layer being present on a substrate, comprising the following steps:

supply of an initial structure comprising at least one non-metallic substrate capable of supporting a graphene layer, formation of a graphene layer on the substrate, wherein the graphene layer covers the totality of a surface of the substrate, hydrogenation of the initial structure by exposure to atomic hydrogen, to obtain the modified graphene layer, with an exposure dose between 100 Langmuirs and 4000 Langmuirs, namely between 13 mPa·s and 533 mPa·s.

2. Method according to claim 1, in which the hydrogenation step takes place after the formation of the graphene layer.

3. Method according to claim 2, in which the exposure dose during hydrogenation is between 100 and 1100 Langmuirs, namely between 13 mPa·s and 147 mPa·s, the graphene layer becoming the semiconducting modified graphene layer with a valency band with the shape of a Dirac cone or a linear dispersion of electronic states.

4. Method according to claim 1, in which at least one surface layer of the substrate is made of SiC, the exposure dose being between 1300 and 2500 Langmuirs or between 1300 and 4000 Langmuirs, namely between 173 mPa·s and 333 mPa·s or between 173 mPa·s and 533 mPa·s, at least one last carbon plane being decoupled from the SiC surface layer, thus forming at least one semiconducting modified graphene layer with a valency band with the shape of a Dirac cone or a linear dispersion of electronic states.

5. Method according to claim 1, in which at least one surface layer of the substrate is made of SiC, the substrate originating from a silicon substrate.

6. Method according to claim 1, comprising annealing that takes place after the hydrogenation step, called post-hydrogenation annealing at a temperature between 200° C. and 400° C., lasting between one minute and twenty minutes.

7. Method according to claim 1, comprising annealing taking place during the hydrogenation step, called hydrogenation annealing at a temperature between 200° C. and 400° C.

8. Method according to claim 1, in which the hydrogenation step takes place at a pressure less than $10^{-4}$ Pascals.

9. Structure comprising at least one semiconducting or insulating substrate, and at least one graphene layer present on this substrate, wherein the graphene layer is a semiconducting modified graphene layer comprising a band gap between 0.2 eV and 1.8 eV, measured by scanning tunneling spectroscopy, and in that it has a dispersion of electronic states, observed by Angle Resolved PhotoEmission Spectroscopy (ARPES or ARUPS) in the form of either a valency band forming a Dirac cone or a linear dispersion of electronic states.

10. Structure according to claim 9, in which added hydrogen atoms (H) form a buffer plane between the modified graphene layer and the SiC substrate, and the added hydrogen atoms (H) are bonded to the SiC of the substrate.

11. Structure according to claim 9, in which several graphene layers are stacked on each other, and are decoupled from each other electronically.

12. Structure according to claim 9, comprising several graphene layers, including a first semiconducting modified graphene layer with a band gap of more than 0.2 eV and with a valency band forming a Dirac cone or a linear dispersion of electronic states, and a second graphene layer with an almost metallic or semiconducting behaviour layer with a zero band gap and separated from the substrate by the first graphene layer.

13. Structure according to claim 12, comprising a third graphene layer inserted between the first graphene layer and the second graphene layer, the third graphene layer being a modified graphene layer with a band gap of more than 0.2 eV and a valency band in the form of a Dirac cone, or a linear dispersion of electronic states.

14. Structure according to claim 13, in which the third graphene layer has a band gap different from the band gap of the first graphene layer.

* * * * *